(12) United States Patent
Sundberg et al.

(10) Patent No.: US 11,539,462 B2
(45) Date of Patent: Dec. 27, 2022

(54) IMPROVING DECODING BY USING KNOWN PUNCTURING INFORMATION

(71) Applicant: Telefonaktiebolaget LM Ericsson (publ), Stockholm (SE)

(72) Inventors: Mårten Sundberg, Årsta (SE); Niklas Andgart, Södra Sandby (SE); John Camilo Solano Arenas, Neuss (DE); Kazuyoshi Uesaka, Kawasaki (JP)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 290 days.

(21) Appl. No.: 16/759,954

(22) PCT Filed: Oct. 31, 2018

(86) PCT No.: PCT/IB2018/058556
§ 371 (c)(1),
(2) Date: Apr. 28, 2020

(87) PCT Pub. No.: WO2019/097339
PCT Pub. Date: May 23, 2019

(65) Prior Publication Data
US 2020/0328845 A1    Oct. 15, 2020

Related U.S. Application Data

(60) Provisional application No. 62/588,235, filed on Nov. 17, 2017.

(51) Int. Cl.
*H04L 1/00* (2006.01)
*H03M 13/45* (2006.01)
(Continued)

(52) U.S. Cl.
CPC .......... *H04L 1/0068* (2013.01); *H03M 13/45* (2013.01); *H04L 1/0003* (2013.01);
(Continued)

(58) Field of Classification Search
CPC ... H04L 1/0068; H04L 1/0003; H04L 5/0044; H03M 13/45; H04W 72/042; H04W 72/0446
See application file for complete search history.

(56) References Cited

U.S. PATENT DOCUMENTS

2007/0242599 A1* 10/2007 Gorday ................. H04L 25/061
370/208
2010/0235722 A1*  9/2010 Lin ......................... H04L 1/005
714/790

(Continued)

FOREIGN PATENT DOCUMENTS

WO    2017074520 A1    5/2017
WO    2019030376 A1    2/2019

OTHER PUBLICATIONS

International Search Report and Written Opinion dated Feb. 1, 2019 for International Application No. PCT/IB2018/058556 filed Oct. 31, 2018, consisting of 16—pages.
(Continued)

*Primary Examiner* — Christine Ng
(74) *Attorney, Agent, or Firm* — Christopher & Weisberg, P.A.

(57) ABSTRACT

A method of operating a first communication node includes receiving a communication at the first communication node from a second communication node, wherein the communication includes information bits in a plurality of information bit positions, determining, by the first communication node, a subset of the information bit positions of the communication that are punctured wherein the determining is performed based on detected or decoded control information, and responsive to determining the subset, reducing, by the first communication node, magnitudes of information bits in the subset of the information bit positions that are punctured.

22 Claims, 14 Drawing Sheets

(51) Int. Cl.
*H04L 5/00* (2006.01)
*H04W 72/04* (2009.01)

(52) U.S. Cl.
CPC ......... *H04L 5/0044* (2013.01); *H04W 72/042* (2013.01); *H04W 72/0446* (2013.01); *H04W 72/0453* (2013.01)

(56) References Cited

U.S. PATENT DOCUMENTS

| | | | | |
|---|---|---|---|---|
| 2014/0006890 | A1* | 1/2014 | Li | H04L 1/1812 |
| | | | | 714/E11.131 |
| 2014/0254444 | A1* | 9/2014 | Kim | H04W 52/0225 |
| | | | | 370/311 |
| 2015/0334685 | A1 | 11/2015 | Ji et al. | |
| 2016/0352481 | A1* | 12/2016 | Jiang | H04W 72/0446 |
| 2017/0033901 | A1* | 2/2017 | Tavildar | H04L 5/0096 |
| 2017/0135116 | A1 | 5/2017 | Kuchibhotla et al. | |
| 2018/0070341 | A1* | 3/2018 | Islam | H04W 72/044 |
| 2018/0234993 | A1* | 8/2018 | Hosseini | H04W 72/1289 |
| 2019/0028309 | A1* | 1/2019 | Noda | G01S 1/00 |
| 2019/0165906 | A1* | 5/2019 | Bala | H04L 27/3488 |
| 2019/0268107 | A1* | 8/2019 | Yasukawa | H04W 28/04 |
| 2019/0319750 | A1* | 10/2019 | Khosravirad | H04L 1/0068 |
| 2021/0168836 | A1* | 6/2021 | Takeda | H04W 72/042 |

OTHER PUBLICATIONS

3GPP TSG-RAN WG1 Meeting #89 R1-1709110; Title: Performance evaluation of DL puncturing; Agenda Item: 7.1.3.3.6; Source: Ericsson; Document for: Discussion, Decision; Location and Date: Hangzhou, China May 15-19, 2017, consisting of 5—pages.

3GPP TSG-RAN WG1 Meeting #89 R1-1708266; Title: Preemption Indication Details for eMBB URLLC Multiplexing; Agenda Item: 7.1.3.3.6; Source: TCL; Document for: Discussion and decision; Location and Date: Hangzhou, China May 15-19, 2017, consisting of 7—pages.

3GPP TSG-RAN WG1 Meeting #89 R1-1708466; Title: Resource sharing between data and control channels; Agenda Item: 7.1.3.1.3; Source: NTT Docomo, Inc.; Document for: Discussion and Decision; Location and Date: Hangzhou, China May 15-19, 2017, consisting of 6—pages.

* cited by examiner

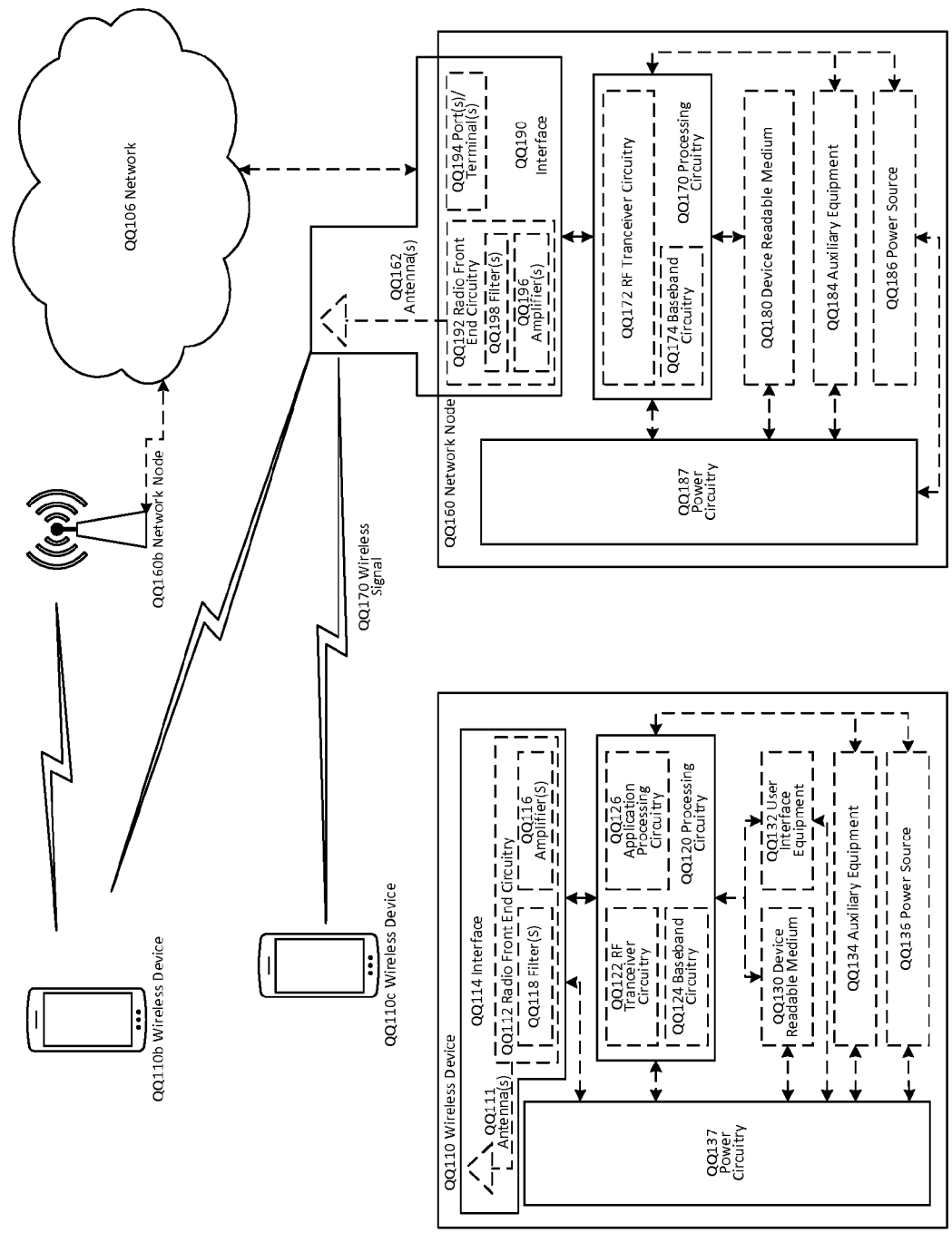
Figure QQ1

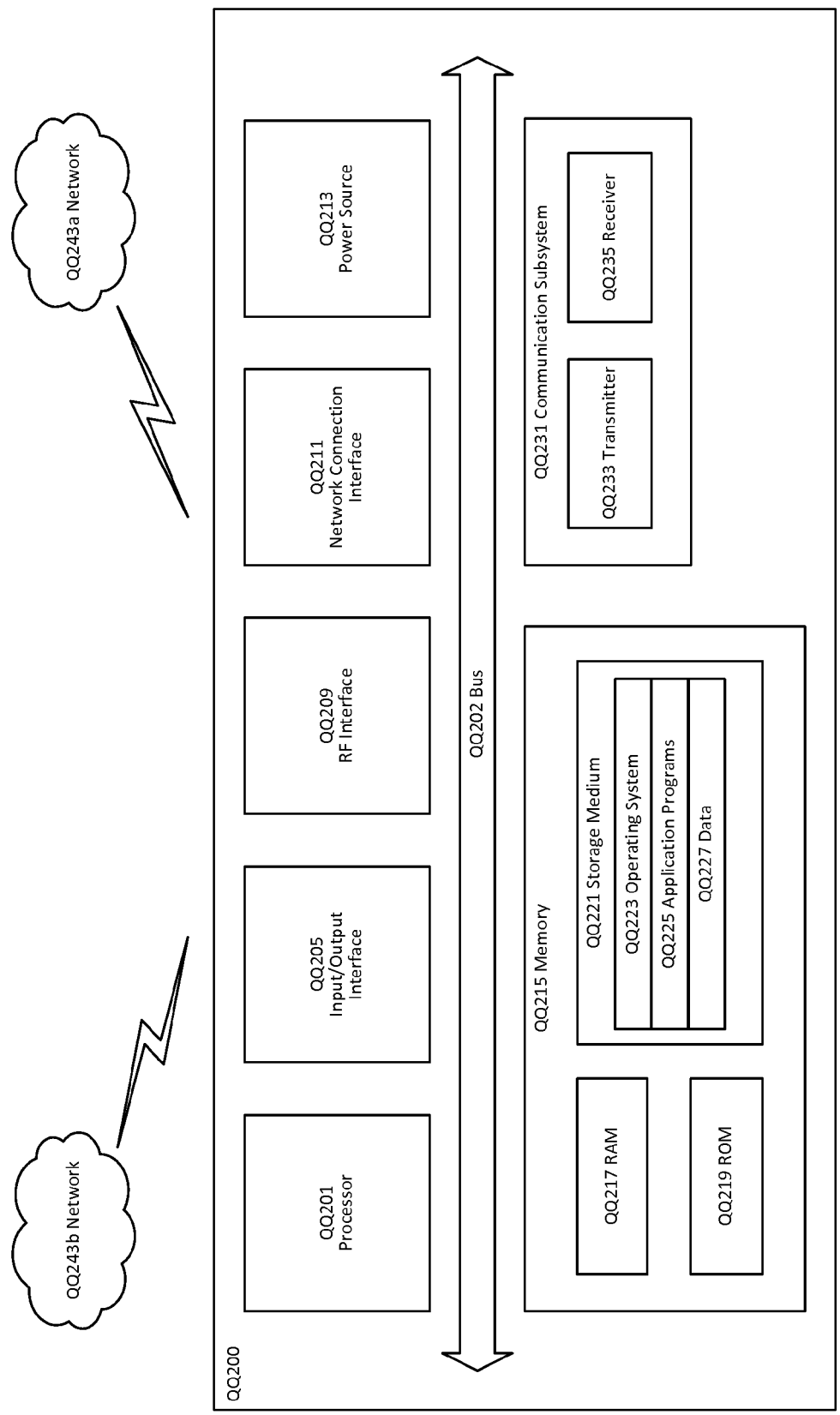
Figure QQ2

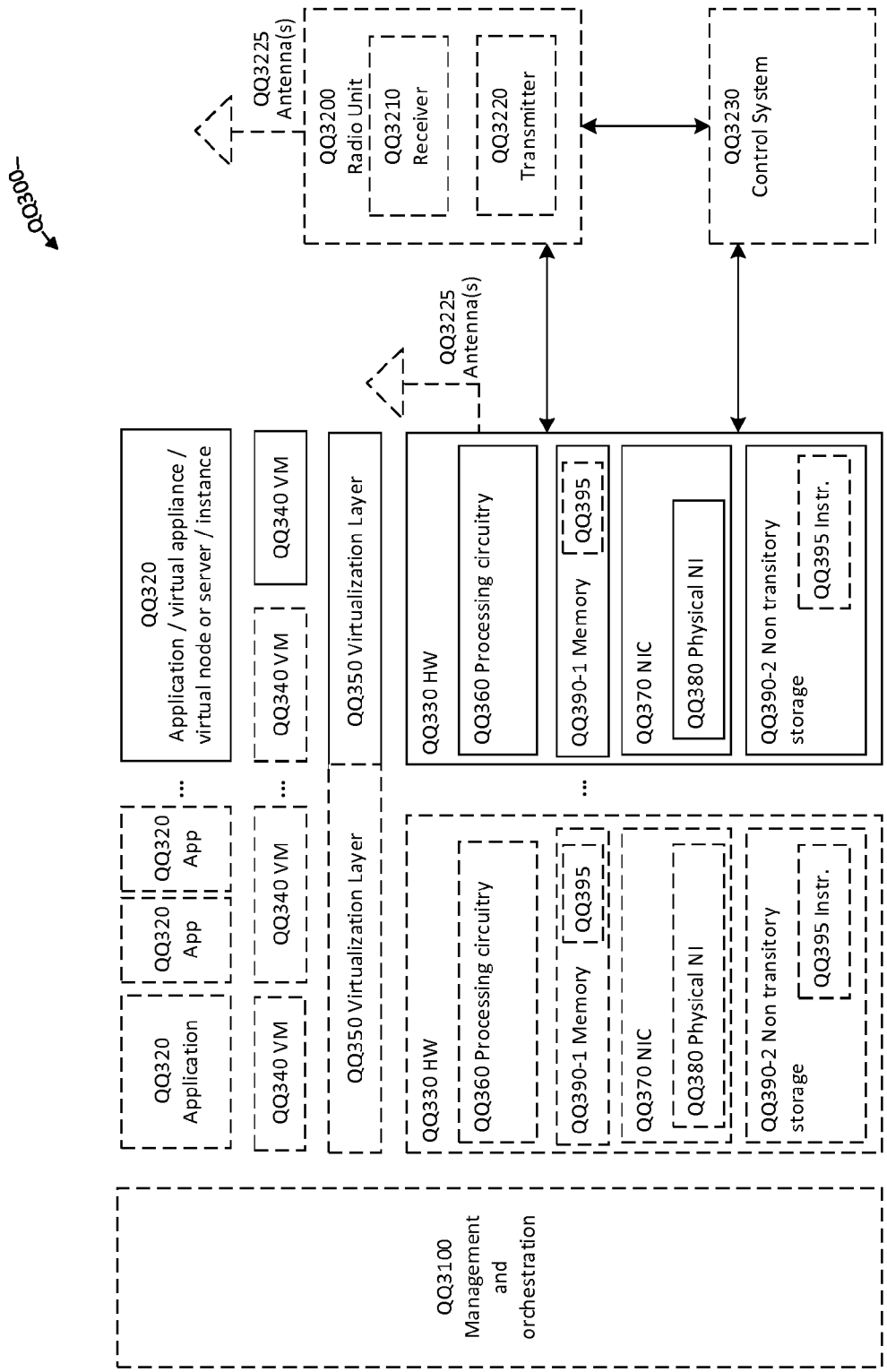
Figure QQ3

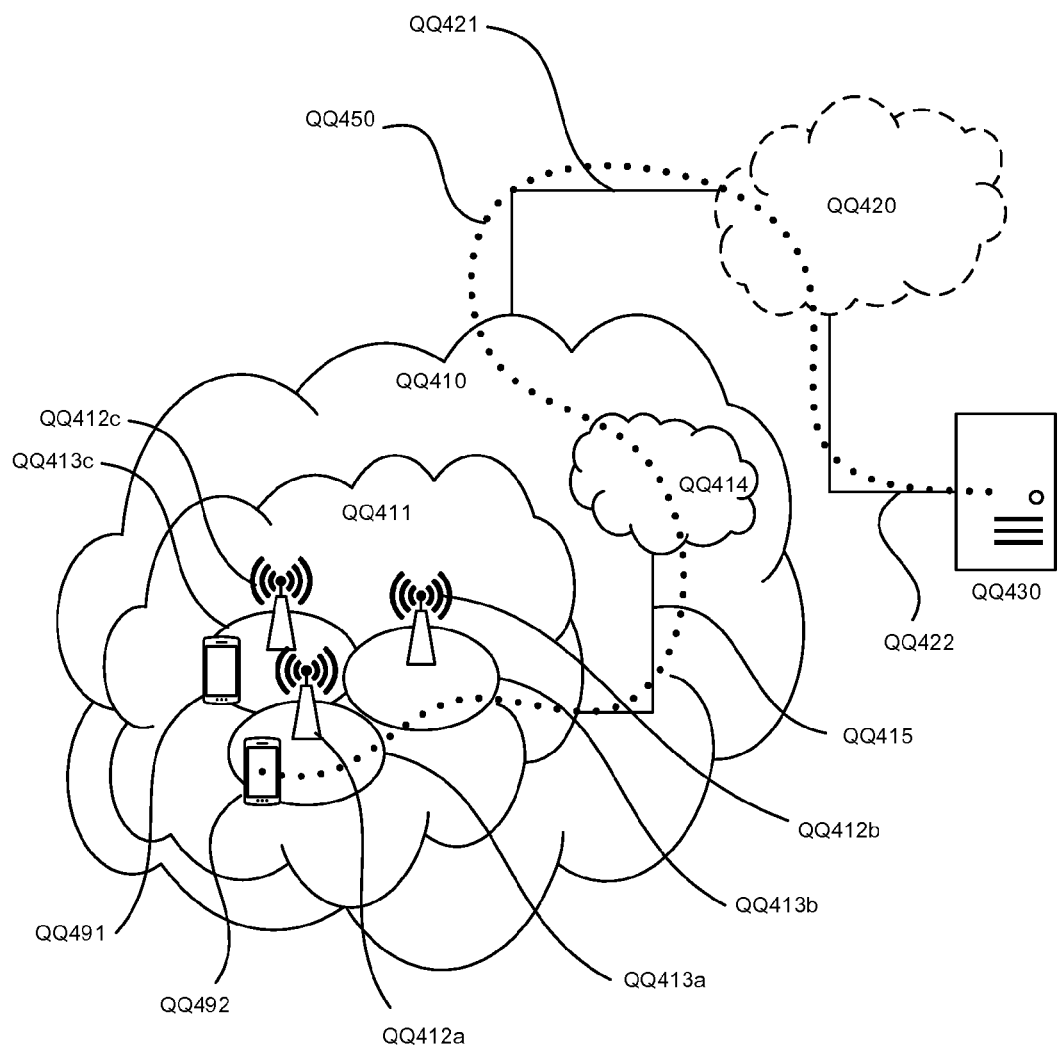
Figure QQ4

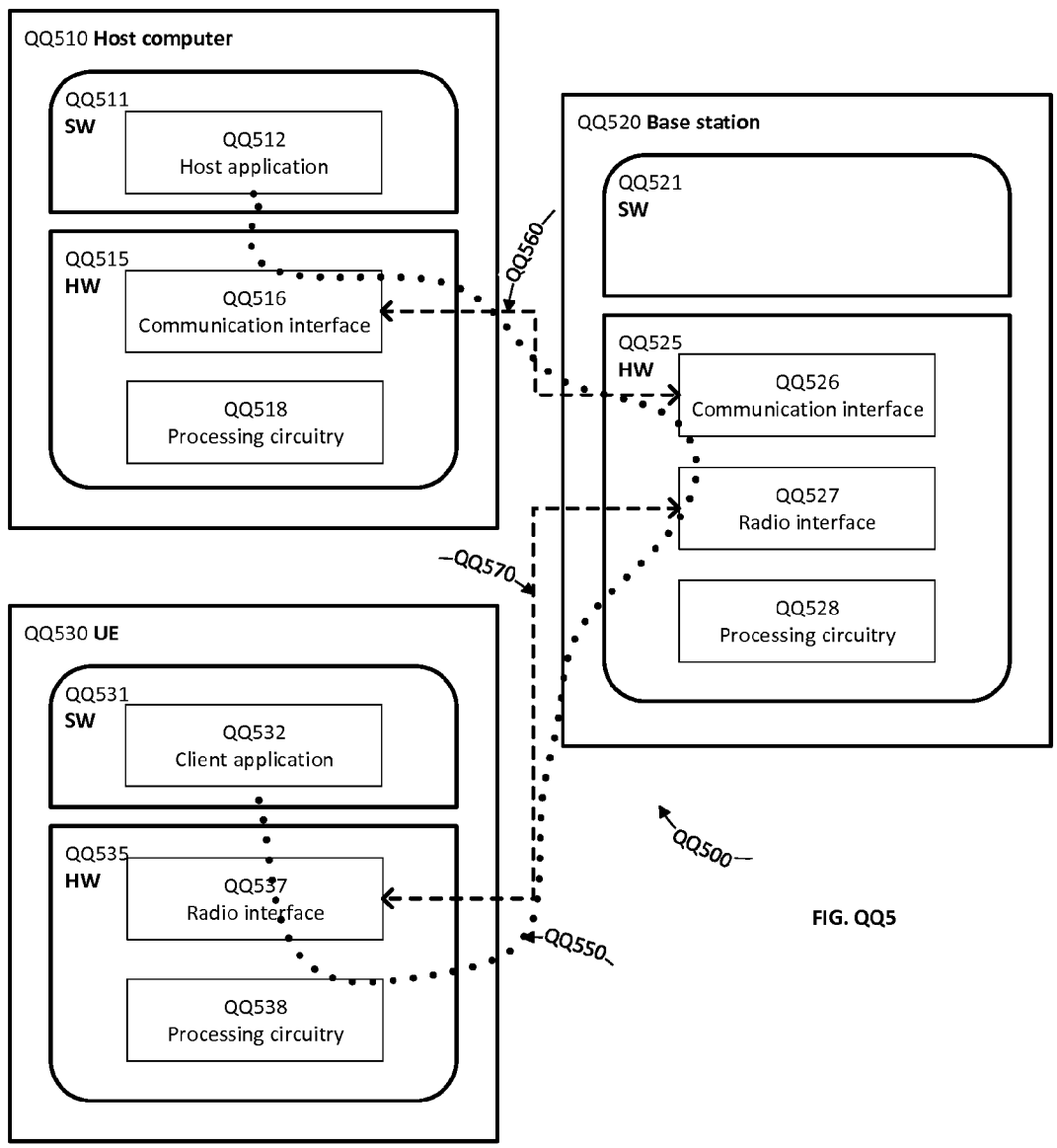
Figure QQ5

IMPROVING DECODING BY USING KNOWN PUNCTURING INFORMATION

CROSS-REFERENCE TO RELATED APPLICATIONS

This application is a Submission Under 35 U.S.C. § 371 for U.S. National Stage Patent Application of International Application No.: PCT/IB2018/058556, filed Oct. 31, 2018 entitled "IMPROVING DECODING BY USING KNOWN PUNCTURING INFORMATION," which claims priority to U.S. Provisional Application No. 62/588,235, filed Nov. 17, 2017, the entireties of both of which are incorporated herein by reference.

BACKGROUND

In radio access networks, the transmission of data from one node to another typically involves sending associated control information with the data in different signals over the air. Control information can be sent separately from the data or in the same transmission as the data. The detection and decoding of the data is typically dependent on the detection and decoding of the associated control information.

For example, to send downlink (DL) data to a user equipment (UE) (or other receiving node) from an eNB (or other transmitting node) in LTE on the Physical Downlink Shared Channel (PDSCH), the UE needs to first decode the Physical Downlink Control Channel (PDCCH) in order to be able to decode the PDSCH. Or, if the Short PDCCH (SPDCCH) is used, this needs to be decoded before being able to decode the associated PDSCH.

Different control messages can be sent to the receiving node, and the control messages need not only be related to the DL data scheduled for the receiving node. For example, FIG. 1 illustrates DL control information and DL data multiplexed over a set of time-frequency resource elements 10. In particular, FIG. 1 illustrates a matrix of time-frequency DL resource elements 10 in which some of the resource elements are allocated to DL data 12, some of the resources are allocated to control information 14 that is not associated with the DL data, and some of the resources are allocated to control information 16 that is associated with the DL data.

Control messages will typically take precedence over data, and hence instead of sending data over certain resource elements, control information may be transmitted in place of the data. To ensure that the data is encoded to a suitable set of resource elements, the code rate (i.e., level of redundancy in the transmission) is matched to the resource elements that are assumed to be available.

This rate-matching can either include or exclude known control information. If the rate-matching only takes part of the control information into account, the remaining control information will have to puncture the rate-matched data bits, since control information usually takes precedence over the data. For example, FIG. 2 illustrates rate-matching of data over part of the control information, while remaining control information is puncturing the data. FIG. 2 illustrates a matrix of time-frequency DL resource elements 10 in which some of the resource elements are allocated to DL data 12 and some of the resources are allocated to control information 16 that is associated with the DL data. Some of the DL resources are nominally allocated to DL data, but have been 'punctured' by, i.e. replaced with, control information 14 that is not associated with the DL data in a puncturing region 20.

Puncturing, or overriding, means that the bits in the affected resource elements are replaced with new information.

SUMMARY

A method of operating a first communication node includes receiving a communication at the first communication node from a second communication node, wherein the communication includes information bits in a plurality of information bit positions, determining, by the first communication node, a subset of the information bit positions of the communication that are punctured wherein the determining is performed based on detected or decoded control information, and responsive to determining the subset, reducing, by the first communication node, magnitudes of information bits in the subset of the information bit positions that are punctured.

By reducing magnitudes of information bits received in information bit locations that are punctured, a performance impact from puncturing/overriding part of a signal transmission can be reduced and/or minimized.

The method may further include determining the subset of the information bit positions based on a decoded downlink control indicator associated with uplink communication from the first communication node to the second communication node.

The method may further include determining the subset of the information bit positions based on detected modulation symbols being different from modulation symbols associated with the information bits.

The method of may further include detecting the information bits in the communication including the information bits in the subset of information bit positions that are punctured responsive to reducing the magnitudes of the information bits in the subset of information bit positions.

Detecting the information bits may include rate matching a number of the information bits in the communication including the information bits in the subset of information bit positions that are punctured.

Detecting the information bits in the communication may include detecting the information bits in the communication excluding control bits in the communication associated with downlink data.

Reducing the magnitudes of the information bits in the subset of information bit positions that are punctured may include zeroing out magnitudes of soft bit values of the information bits in the subset of information bit positions that are punctured.

Reducing the magnitudes of the information bits in the subset of information bit positions that are punctured may include setting magnitudes of soft bit values of the information bits in the subset of information bit positions that are punctured to a small number.

Reducing the magnitudes of the information bits in the subset of information bit positions that are punctured may include down scaling magnitudes of soft bit values of the information bits in the subset of information bit positions that are punctured.

The subset of the information bit positions that are punctured may include control information.

The communication may be a first communication, and the control information may include uplink control information that is associated with a second communication from the first communication node to the second communication node.

The method may further include transmitting the second communication from the first communication node to the second communication node, wherein the second communication is transmitted using the control information.

The method may further include detecting (1000) information bits in the subset of the information bit positions that are punctured to obtain the control information.

A location in a time-frequency space of the subset of the information bit positions that are punctured may be known to the first communication node.

The method may further include detecting (1102) downlink control information, DCI, in the communication, and determining (1104) the location of the subset of information bit positions that are punctured from the DCI.

The DCI may include uplink, UL, DCI that schedules UL resources for use by the first communication node.

The control information may be provided by the second communication node to override data bits in the subset of the information bit positions that are punctured.

The method may further include receiving downlink control information, DCI, at the first communication node from the second communication node, wherein the DCI indicates that the control information is included in the subset of the information bits that are punctured.

The method may further include receiving downlink control information at the first communication node from the second communication, wherein the downlink control information indicates that the control information is associated with a third communication node.

The first communication node may include a first user equipment node, the second communication node may include a radio access network node, and the third communication node may include a second user equipment node.

The method may further include determining at the first communication node an estimate of a modulation used in a search space, wherein the subset of the information bit positions that are punctured is determined responsive to determining that the estimate of the modulation is different than a signalled modulation that is signalled on a scheduling assignment from the second communication node.

The first communication node may include a user equipment node, the second communication node may include a radio access network node, and the communication may include a downlink communication.

Some embodiments provide a first communication node adapted to perform a method including receiving a communication at the first communication node from a second communication node, wherein the communication includes information bits in a plurality of information bit positions, determining, by the first communication node, a subset of the information bit positions of the communication that are punctured, and responsive to determining the subset, reducing, by the first communication node, magnitudes of information bits in the subset of the information bit positions that are punctured.

Some embodiments provide a first communication node that includes a transceiver configured to provide communication with a second communication node over a wireless interface, and a processor coupled with the transceiver, wherein the processor is configured to provide reception/transmission from/to the second communication node through the transceiver, and wherein the processor is configured to perform operations including receiving a communication at the first communication node from a second communication node, wherein the communication includes information bits in a plurality of information bit positions, determining, by the first communication node, a subset of the information bit positions of the communication that are punctured, and responsive to determining the subset, reducing, by the first communication node, magnitudes of information bits in the subset of the information bit positions that are punctured.

Some embodiments provide a first communication node that includes respective modules adapted to perform a method including receiving a communication at the first communication node from a second communication node, wherein the communication includes information bits in a plurality of information bit positions, determining, by the first communication node, a subset of the information bit positions of the communication that are punctured, and responsive to determining the subset, reducing, by the first communication node, magnitudes of information bits in the subset of the information bit positions that are punctured.

FIG. QQ1 is a block diagram of a wireless network in accordance with some embodiments.

FIG. QQ2 is a block diagram of a user equipment in accordance with some embodiments.

FIG. QQ3 is a block diagram of a virtualization environment in accordance with some embodiments.

FIG. QQ4 is a block diagram of a telecommunication network connected via an intermediate network to a host computer in accordance with some embodiments.

FIG. QQ5 is a block diagram of a host computer communicating via a base station with a user equipment over a partially wireless connection in accordance with some embodiments.

DESCRIPTION OF EMBODIMENTS

Figure 1:
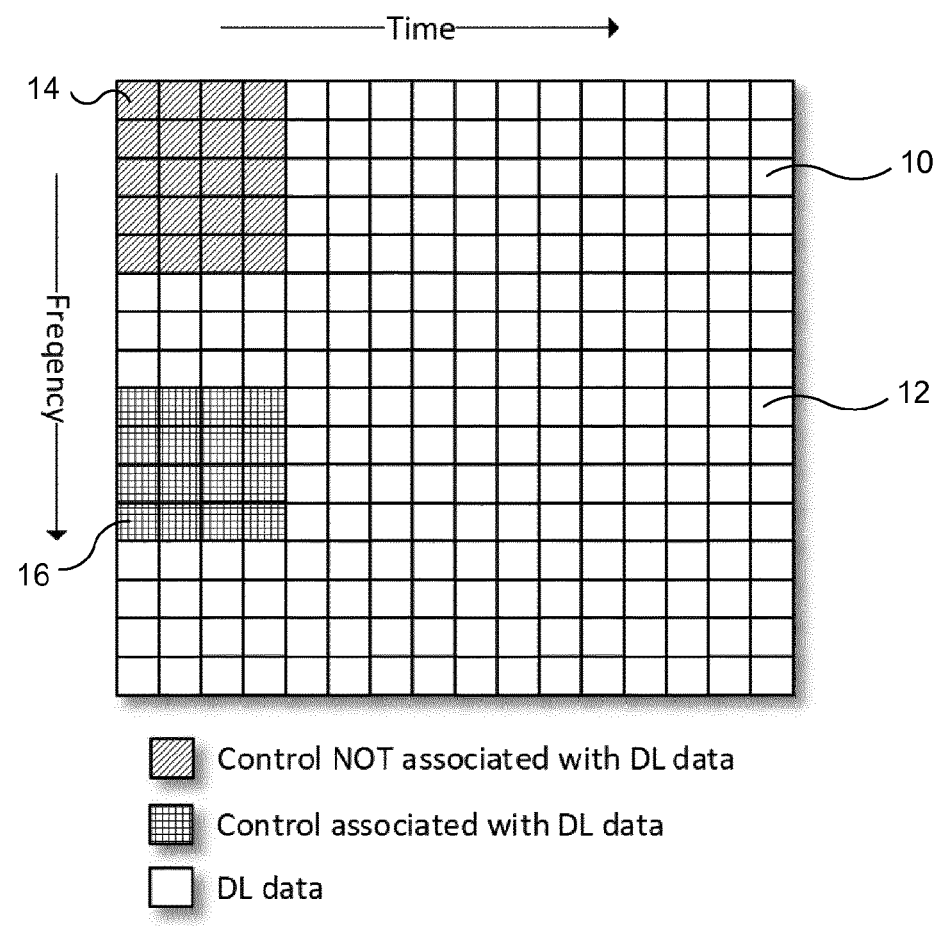
FIG. 1 illustrates DL control information and DL data multiplexed over a set of time-frequency resource elements
Figure 2:
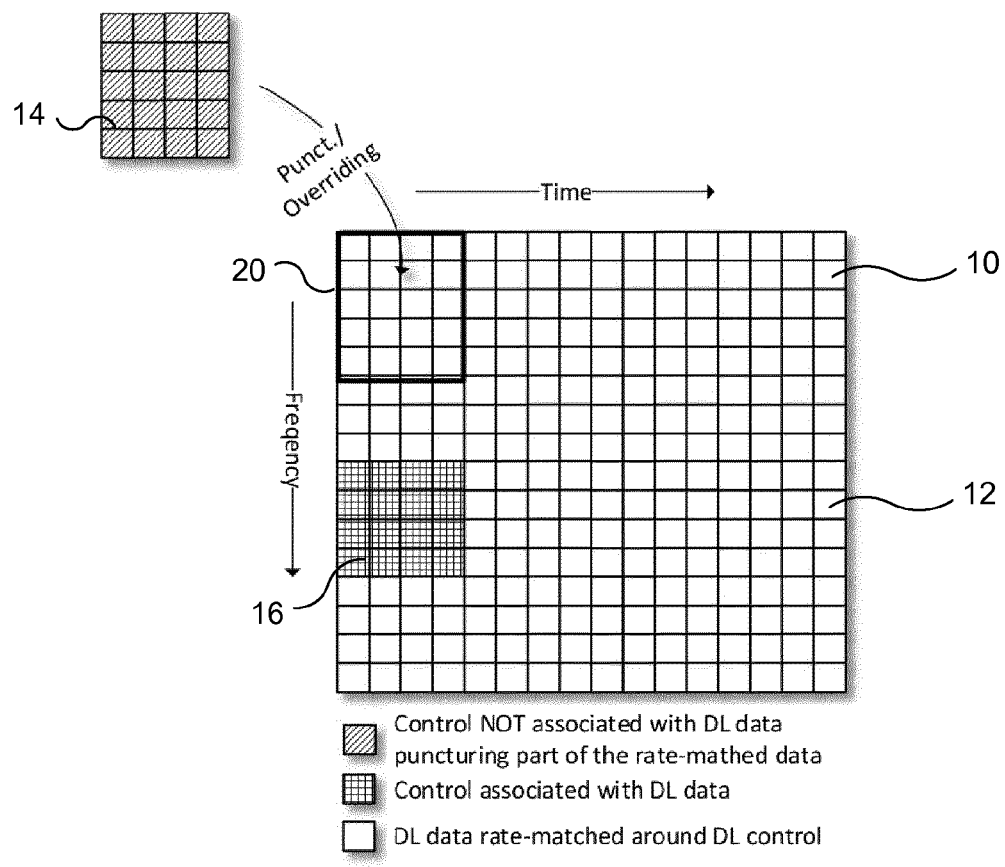
FIG. 2 illustrates a matrix of time-frequency DL resource elements in which some of the resource elements are allocated to D data and some of the resources are allocated to control information that is associated with the DL data.

There currently exist certain challenges in the approaches described above. For example, if the approach illustrated in FIG. 2 is followed, the decoding of the data in the receiving node could be largely affected by the puncturing, since the estimated bit state of a bit in the punctured region is believed by the receiving node to be part of the transmitted data. This can reduce the performance of the decoder in the receiving node.

Figure 3:
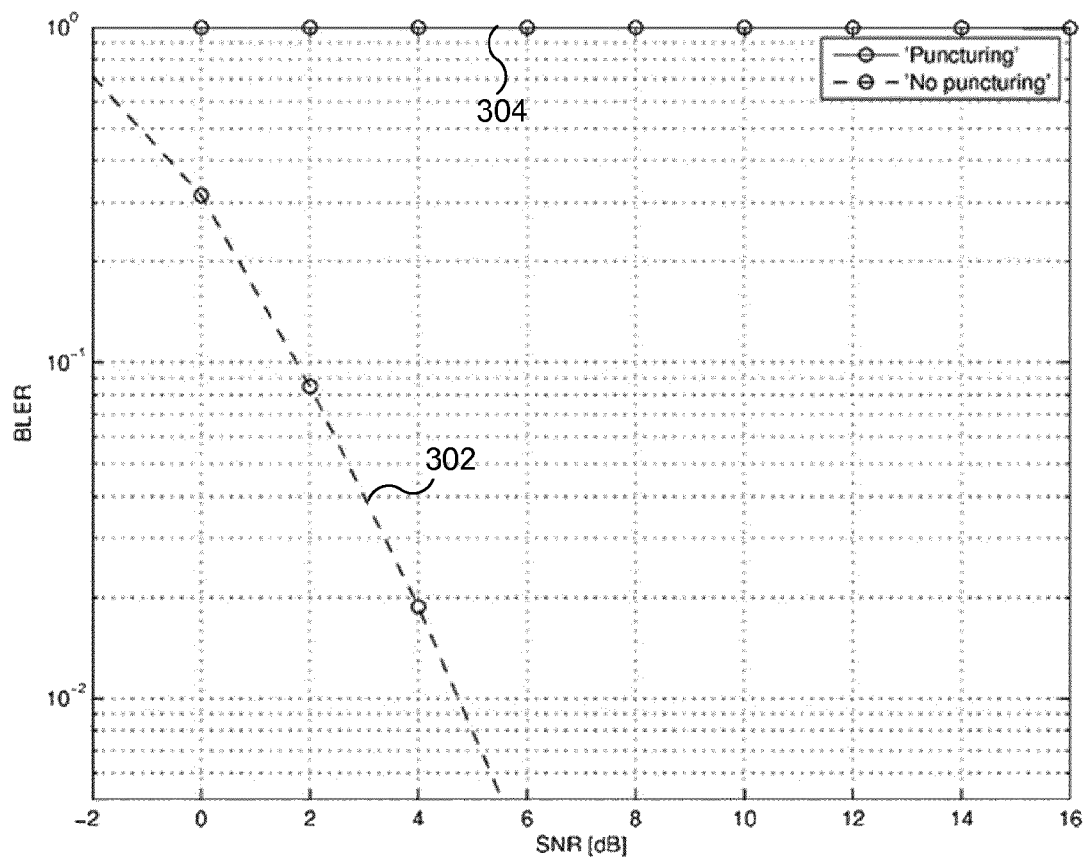
FIG. 3 is a graph of a link simulation showing the impact of puncturing.

An example is provided in FIG. 3, which is a graph of a link simulation showing the impact of puncturing. In particular, FIG. 3 is a graph of block error rate (BLER) as a function of signal to noise ratio (SNR) for the case of both punctured (304) and non-punctured (302) transmissions. In the example illustrated in FIG. 3, a simulated puncturing of 17% of a transmission with QPSK and code rate 0.5 (robust format with low modulation and low 100% redundancy) completely collapses the performance such that a high block error rate is experienced even for signals with high signal-to-noise ratio (SNR) levels.

An alternative to puncturing is to rate-match around all known control information. However, in that case, the receiver would instead be dependent on correctly receiving all control information in order to be able to decode the data. Assume for example that there is control associated with both DL and uplink (UL) data and that the DL data is rate-matched around both. In that case, the receiving node would have to detect and decode both the control information associated with the DL data and the control information associated with the UL data in order to decode the DL data. This creates an unwanted dependency for the reliability of the DL data (especially if there are several control types that the data would be rate-matched around).

Certain aspects of the inventive concepts may provide solutions to the challenges described above. In particular, embodiments of the inventive concepts relate to an implementation at the receiving node to reduce/minimize the impact of the possible puncturing at the transmitting node.

In some embodiments, the receiving node reduces/minimizes the magnitudes of the information bits at bit positions that are known to be punctured by the transmitting node. In some embodiments, the reduction/minimization of the magnitudes of the information bits includes zeroing out soft bit values. In further embodiments, the reduction/minimization of the magnitudes of the information bits includes setting the soft bit values to a small number. In still further embodiments, the reduction/minimization of information includes down scaling the soft bit values.

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

The inventive concepts relate to an implementation at the receiving node to reduce and/or minimize the impact of the possible puncturing of a transmission by the transmitting node. In particular, embodiments of the inventive concepts may improve receiver performance when receiving punctured transmissions where the puncturing is known to the receiver and can be compensated for by the receiver.

In a first embodiment the receiving node reduces/minimizes the information bit magnitudes at bit positions known to be punctured by the transmitting node. That is, the receiver generates soft bit values for each received bit. For bits received in a time/frequency resource that is known to be punctured, the receiver reduces/minimizes the magnitude of the soft bit values.

In some embodiments the reduction/minimization of information includes zeroing out the soft bit values, i.e., reducing the magnitudes of the soft bit values to zero. In some embodiments the reduction/minimization of information includes setting the soft bit values to a small non-zero value. In some embodiments the reduction/minimization of information includes down-scaling the magnitudes of the soft bit values. As will be appreciated, the sign of a soft bit value indicates whether the bit value represents a '1' or a '0', while the magnitude of the bit value represents the probability of the representation being correct, e.g., the probability that the transmitted bit is correctly represented by the sign of the received soft bit value. The soft bit value magnitudes are taken into account by the receiver during the decoding process. Reducing the magnitude of the soft bit values of bits that are known to correspond to punctured resource elements as described herein may cause the receiver to place less weight on such bits during the decoding process, thereby increasing the accuracy of the decoding process.

Figure 4:
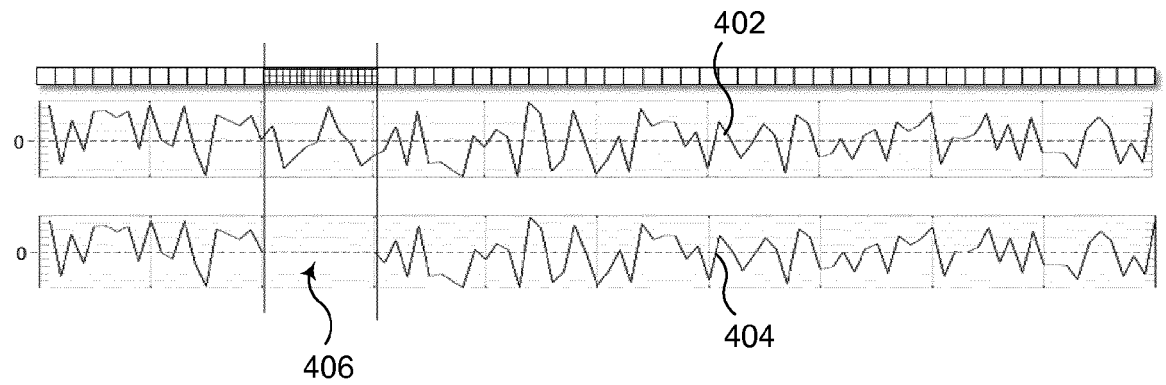
FIG. 4 is a graph of soft bit values detected at a receiver according to some embodiments.

A method of processing a received signal according to some embodiments is illustrated in FIG. 4, which is a graph of soft bit values detected at a receiver. The top portion of FIG. 4 (402) shows the soft bit values actually detected at the receiver, where bit value 0 is indicated by a positive value and bit value 1 is indicated by a negative value. The larger the magnitude of the value, the more certain the receiver is of the bit state. For example, a high positive value means that the receiver is more certain that a 0 has been transmitted in that interval. In the lower part of the FIG. 404), the magnitudes of the soft bit values within a region 406 that is known by the receiver to include punctured control information have been reduced. In particular, in the example illustrated in FIG. 4 the magnitudes of the soft bit values within the region 406 that is known by the receiver to include punctured control information have been set to zero.

Figure 5:
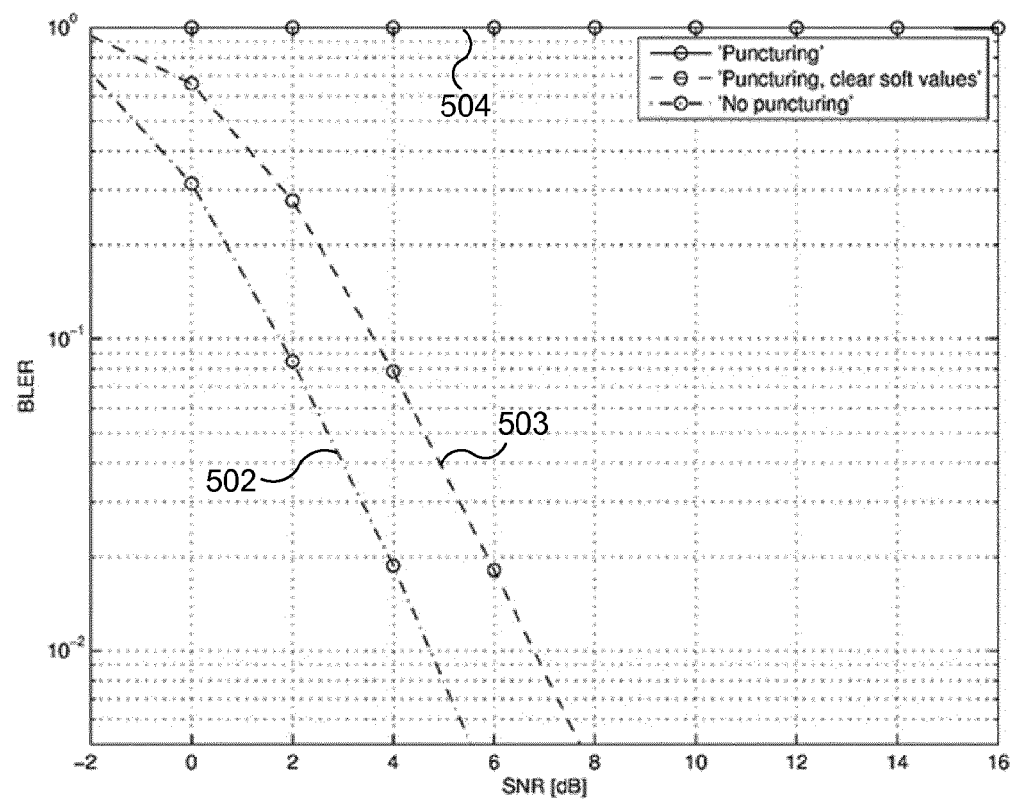
FIG. 5 is a graph of a link simulation showing the impact of zeroing out soft bit values corresponding to punctured control information according to some embodiments.

The effect of this zeroing of punctured control information is illustrated in FIG. 5, which is a graph of a link simulation showing the impact of zeroing out soft bit values corresponding to punctured control information. In particular, FIG. 5 is a graph of block error rate (BLER) as a function of signal to noise ratio (SNR) for the case of punctured transmissions (504), non-punctured transmissions (502), and punctured transmissions in which magnitudes of the soft bit values are set to zero at the receiver (503). In the example illustrated in FIG. 5, a simulated puncturing of 17% of a transmission with QPSK and code rate 0.5 (robust format with low modulation and low 100% redundancy) again collapses the performance of the receiver, as illustrated by curve 504 in FIG. 5. However, when magnitudes of the soft bit values are cleared (i.e. set to zero) at the punctured locations, the BLER is substantially improved as shown in curve 503, although with some SNR loss due to the higher effective code rate relative to the non-punctured case shown in curve 502.

In some embodiments, the punctured bit positions include control information transmitted to the receiving node associated with an uplink transmission by the receiving node. The punctured bit positions associated with UL transmission from the receiving node are detected/decoded, or known to the receiving node.

In some embodiments, a bit field may be added in the DL control information to indicate to the receiving node if a control candidate is carrying UL control information. This bit field identifies the control candidate from the receiving node search space. Thus, if the UL control information is not decoded/detected by the receiving node, the receiving node already knows, from the DL control information, the position of the soft bits which need to be zeroed out.

In some embodiments, the punctured bit positions may include control information for other receiving nodes associated with either DL or UL transmissions.

In some embodiments, the punctured bit positions associated with other receiving nodes are known to the receiving node. For example, the transmitting node may signal the punctured bit positions to the receiving node in the DL control information. In further embodiments, the receiving node may detect the control information associated with other receiving nodes, to be able to determine which bit positions are punctured.

In some embodiments, the punctured bit positions associated with UL transmission from the receiving node are not detected/decoded, or associated with UL or DL transmission signalling to other UEs. Instead, the UE may estimate the modulation used in a possible search space, i.e., a location in a time-frequency space where the UE may expect to find control information puncturing the received data. If the modulation used in the possible search space is different from the modulation used for data which is signalled on the downlink scheduling assignment, the UE may assume the bits are punctured and can reduce/minimize the magnitudes of information bits in these bit positions by applying one or more of the techniques described above to modify the estimated soft bit values.

Figure 6A:
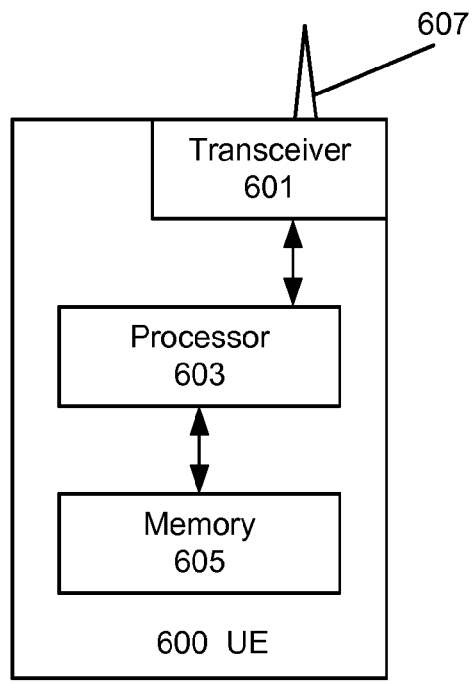
FIG. 6A is a block diagram illustrating some aspects of a user equipment node according to some embodiments.

FIG. 6A is a block diagram illustrating elements of a UE 600 (also referred to as a wireless terminal, a wireless communication device, a wireless communication terminal, user equipment, a user equipment node/terminal/device, etc.) configured to operate according to embodiments disclosed herein. As shown, the UE 600 may include at least one antenna 607 (also referred to as antenna), and at least one transceiver circuit 601 (also referred to as transceiver) including a transmitter and a receiver configured to provide uplink and downlink radio communications with a base station or other radio transceiver element of a radio access network. The UE 600 may also include at least one processor circuit 603 (also referred to as processor) coupled to the transceiver 601, and at least one memory circuit 605 (also referred to as memory) coupled to the processor 603. The memory 605 may include computer readable program code that when executed by the processor 603 causes the processor 603 to perform operations according to embodiments disclosed herein for a UE. According to other embodiments, processor 603 may be defined to include memory so that a separate memory circuit is not required. The UE 600 may also include an interface (such as a user interface) coupled with processor 603.

As discussed herein, operations of the UE 600 may be performed by processor 603 and/or transceiver 601. Alternatively, or additionally, the UE 600 may include modules, e.g., software and/or circuitry, that performs respective operations (e.g., operations discussed herein with respect to example embodiments of UEs).

Figure 6B:
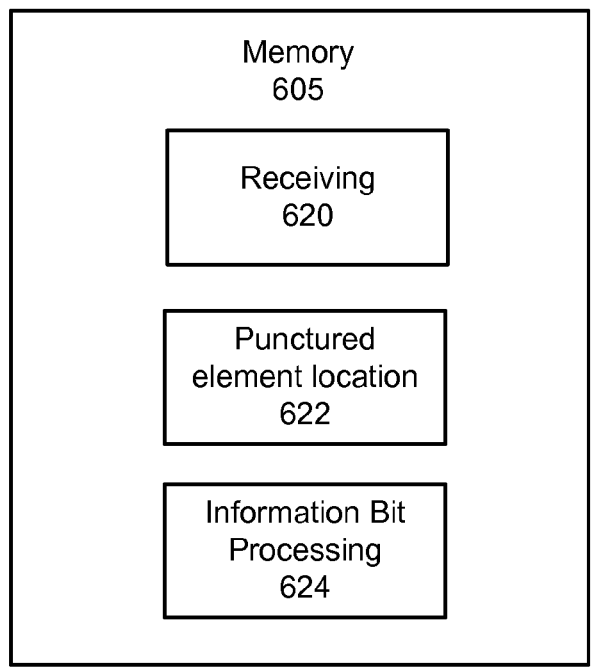
FIG. 6B is a block diagram illustrating some functional modules of a user equipment node according to some embodiments.

FIG. 6B illustrates functional modules that may be stored in the memory 605 of the UE 600 and that may configure the UE 600 to perform operations described herein. For example, the UE 600 may include a receiving module 620 for receiving signals through the transceiver 601, a punctured element location module for determining the location in a time-frequency space of punctured bit positions in the received signal, and an information bit processing module 624 for reducing magnitudes of soft information bits corresponding to punctured bit positions in the received signal.

Figure 7A:
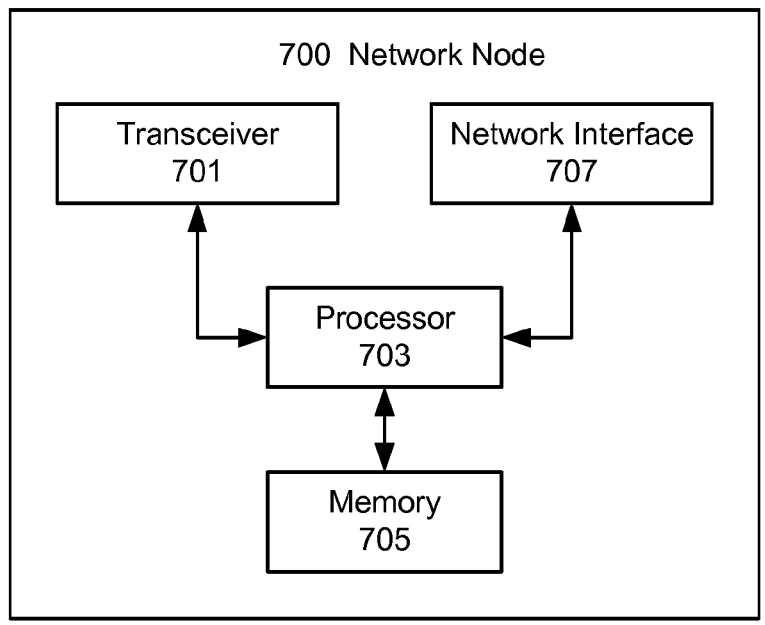
FIG. 7A is a block diagram illustrating some aspects of a network node according to some embodiments.

FIG. 7A is a block diagram illustrating elements of a network node 700 according to one or more embodiments disclosed herein. As shown, the network node 700 may include at least one transceiver circuit 701 (also referred to as a transceiver) including a transmitter and a receiver configured to provide uplink and downlink radio communications with UEs. The network node 700 may include at least one network interface circuit 707 (also referred to as a network interface) configured to provide communications with other network nodes, such as one or more nodes of a radio access network, a core network, and/or another system node. The network node 700 may also include at least one processor circuit 703 (also referred to as a processor) coupled to the transceiver 701, and at least one memory circuit 705 (also referred to as memory) coupled to the processor 703. The memory 705 may include computer readable program code that when executed by the processor 705 causes the processor 705 to perform operations according to embodiments disclosed herein for a network node. According to other embodiments, processor 703 may be defined to include memory so that a separate memory circuit is not required.

As discussed herein, operations of the network node may be performed by processor 703, network interface 707, and/or transceiver 701. For example, processor 703 may control transceiver 701 to transmit communications through transceiver 701 over a radio interface to one or more UEs and/or to receive communications through transceiver 701 from one or more UEs over a radio interface. Similarly, processor 703 may control network interface 707 to send communications through network interface 707 to one or more other network nodes and/or other system nodes, and/or to receive communications through network interface 707 from one or more other network nodes and/or other system nodes. Alternatively, or additionally, the network node 700 may include modules, e.g., circuitry, that performs respective operations (e.g., operations discussed herein with respect to example embodiments of network nodes).

Figure 7B:
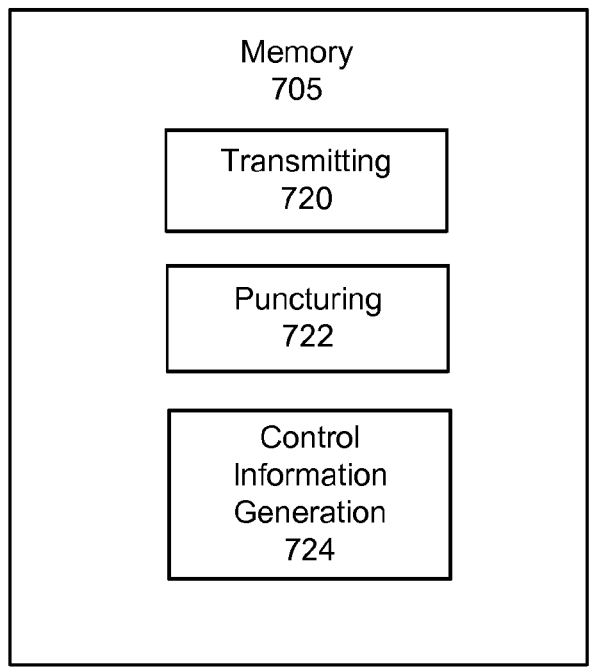
FIG. 7B is a block diagram illustrating some functional modules of a network node according to some embodiments.

FIG. 7B illustrates functional modules that may be stored in the memory 705 of the network node 700 and that may configure the UE 600 to perform operations described herein. For example, the network node 700 may include a transmitting module 720 for transmitting signals through the transceiver 701, a puncturing module 722 for puncturing data in a transmission, and a control information generation module 724 for generating control information identifying a location of the punctured data.

In some embodiments, some or all of the operations described herein may be implemented as virtual components executed by one or more virtual machines implemented in one or more virtual environments hosted by one or more of network nodes. Further, in embodiments in which the virtual node is not a radio access node or does not require radio connectivity (e.g., a core network node), then the network node may be entirely virtualized.

The operations may be implemented by one or more applications (which may alternatively be called software instances, virtual appliances, network functions, virtual nodes, virtual network functions, etc.) operative to implement some of the features, functions, and/or benefits of some of the embodiments disclosed herein. Applications are run in a virtualization environment which provides hardware comprising processing circuitry and memory. Memory contains instructions executable by processing circuitry whereby application is operative to provide one or more of the features, benefits, and/or functions disclosed herein.

Figure 8:
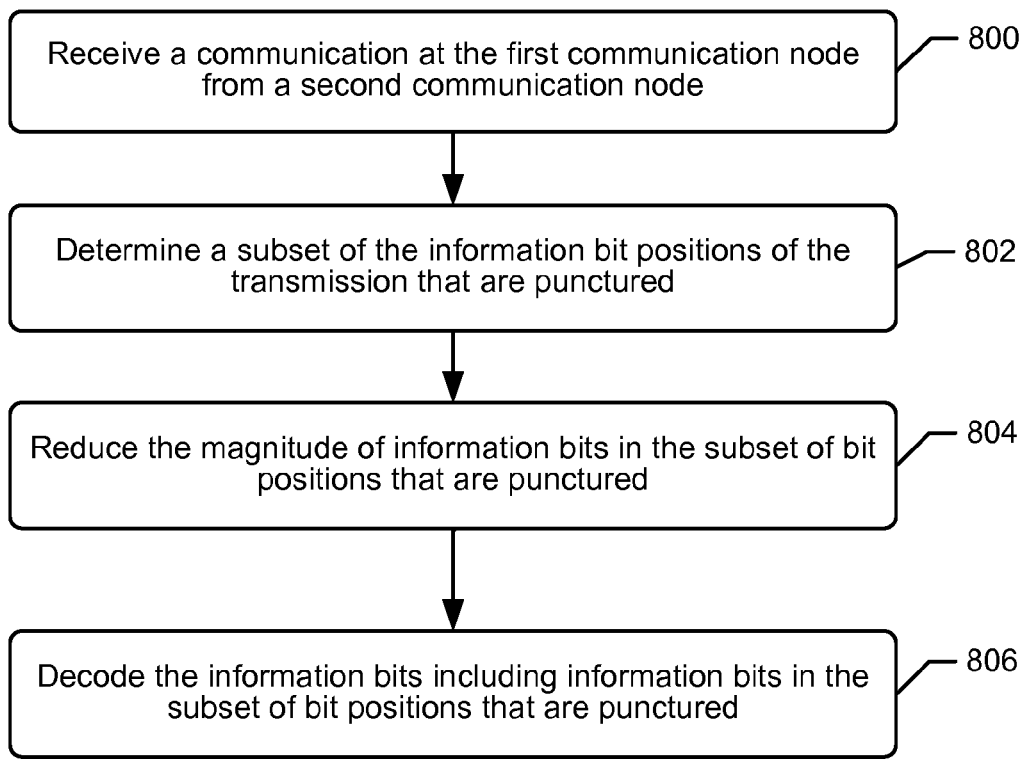
FIGS. 8, 9, 10, 11 and 12 are flowcharts illustrating operations of systems/methods according to some embodiments.

Systems/methods according to some embodiments are illustrated in the flowchart of FIG. 8. As shown therein, a method of operating a first communication node includes receiving (800) a communication at the first communication node from a second communication node, wherein the communication includes a plurality of information bit positions; determining (802) by the first communication node a subset of the information bit positions of the communication that are punctured; and responsive to determining the subset, reducing (804) by the first communication node the magnitudes of information bits at bit positions of the subset that are punctured.

Figure 9:
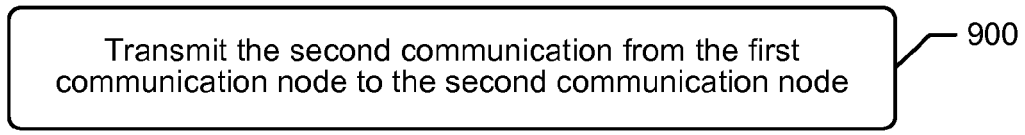

Further operations according to some embodiments are illustrated in the flowchart of FIG. 9, which illustrates transmitting (900) a second communication from the first communication node to the second communication node.

Figure 10:
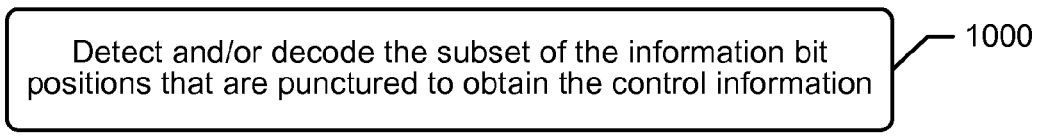

Still further operations according to some embodiments are illustrated in the flowchart of FIG. 10, which illustrates detecting and/or decoding (1000) the subset of the information bit positions that are punctured to obtain control information.

Figure 11:
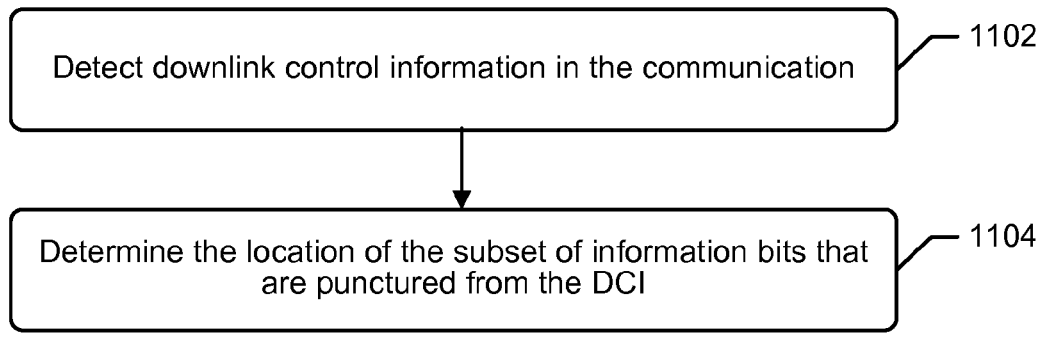

Still further operations according to some embodiments are illustrated in the flowchart of FIG. 11, which illustrates detecting (1102) downlink control information, DCI, in the communication from the second node and determining (1104) the location of the subset of information bits that are punctured from the DCI.

Figure 12:
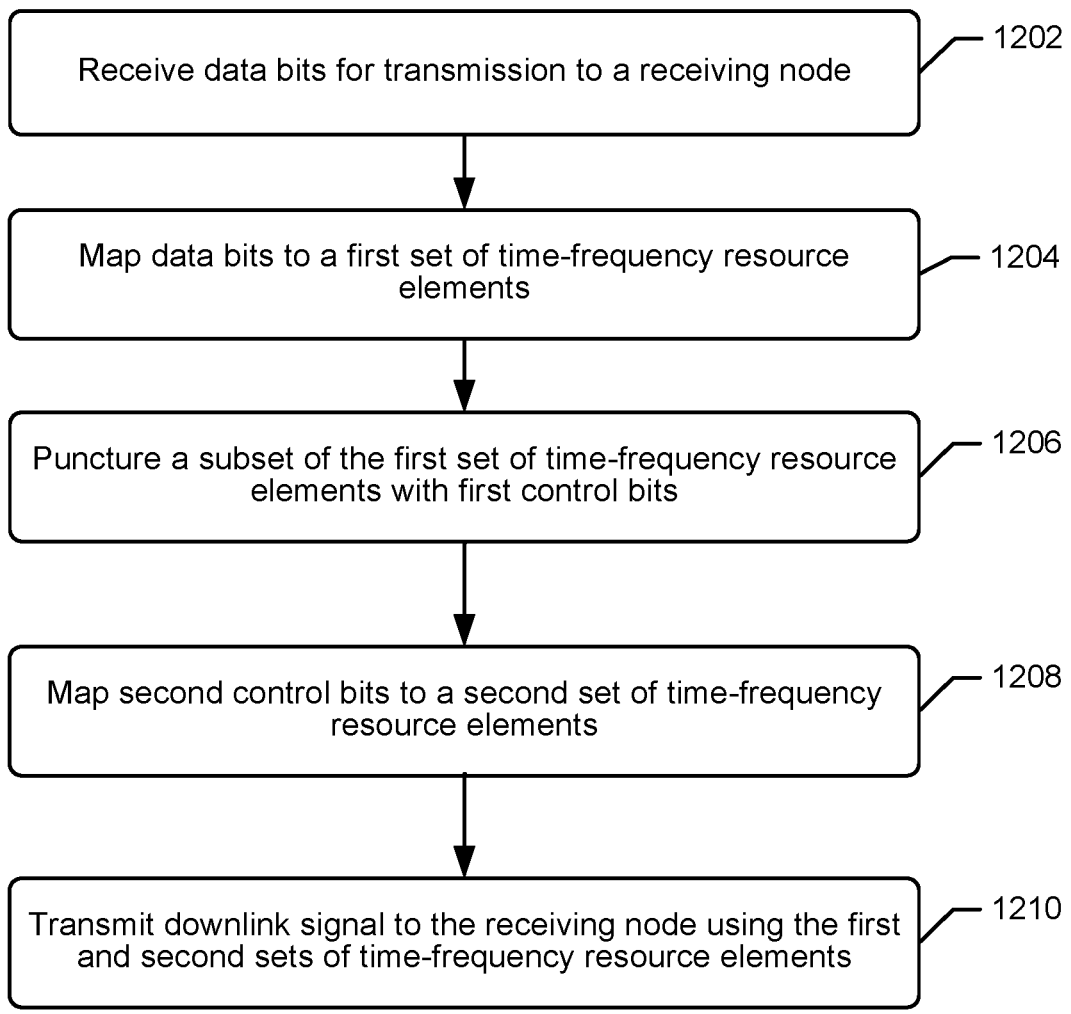

Operations of a network node 700 according to some embodiments are illustrated in FIG. 12. As shown therein, a network node 700 may receive (1202) data bits for transmission to a receiving node, map (1204) the data bits to a first a set of time-frequency resource elements, puncture (1206) a subset of the first set of time-frequency resource elements by replacing data bits mapped to the subset of the first set of time-frequency resource elements with first control bits, map (1208) second control bits to a second set of time-frequency resource elements, wherein the second control bits indicate a location of the subset of the first set of time-frequency resources, and transmit (1210) a downlink signal to the receiving node including the first set of time-frequency resource elements and the second set of time-frequency resource elements. The data bits may be rate matched to the first set of time-frequency resource elements. The second control information may include downlink control information, DCI.

Certain embodiments may provide one or more technical advantage(s). In particular, a performance impact from puncturing/overriding part of a signal transmission can be reduced and/or minimized. This is illustrated in FIG. 5 which shows the same setup as FIG. 4, where the robust QPSK r½ format loses performance when being punctured at 17% of the resources. Using one or more of the techniques described herein, where the soft bits are cleared on the punctured locations, the reception works again, although with some SNR loss due to the higher effective code rate.

Embodiments of the inventive concepts may be implemented in the cloud by performing the detection/decoding and the related modification of the soft bit states not on the hardware associated with the receiving node, but in the cloud.

Further Definitions and Embodiments

In this disclosure a receiving node and a transmitting node is referred to. In the embodiments in one example the transmitting node can be a UE and the receiving node can be a network node. In another example the transmitting node can be a network node and the receiving node can be a UE. In yet another example the transmitting and receiving node can be involved in direct device to device communication, that is both can be considered UEs. Examples of device to device communication are proximity service (ProSe), ProSe direct discovery, ProSe direct communication, V2X (where X can denote V, I or P e.g. V2V, V2I, V2P etc) etc.

A network node is a more general term and can correspond to any type of radio network node or any network node, which communicates with a UE and/or with another network node. Examples of network nodes are NodeB, base station (BS), multi-standard radio (MSR) radio node such as MSR BS, eNodeB, gNodeB. MeNB, SeNB, network controller, radio network controller (RNC), base station controller (BSC), road side unit (RSU), relay, donor node controlling relay, base transceiver station (BTS), access point (AP), transmission points, transmission nodes, RRU, RRH, nodes in distributed antenna system (DAS), core network node (e.g. MSC, MME etc), O&M, OSS, SON, positioning node (e.g. E-SMLC) etc.

Another example of a node could be user equipment, this is a non-limiting term user equipment (UE) and it refers to any type of wireless device communicating with a network node and/or with another UE in a cellular or mobile communication system. Examples of UE are target device, device to device (D2D) UE, V2X UE, ProSe UE, machine type UE or UE capable of machine to machine (M2M) communication, PDA, iPAD, Tablet, mobile terminals, smart phone, laptop embedded equipped (LEE), laptop mounted equipment (LME), USB dongles etc.

The term radio access technology, or RAT, may refer to any RAT e.g. UTRA, E-UTRA, narrow band internet of things (NB-IoT), WiFi, Bluetooth, next generation RAT (NR), 4G, 5G, etc. Any of the first and the second nodes may be capable of supporting a single or multiple RATs.

The term signal used herein can be any physical signal or physical channel Examples of downlink physical signals are reference signal such as PSS, SSS, CRS, PRS, CSI-RS, DMRS, NRS, NPSS, NSSS, SS, MBSFN RS etc. Examples of uplink physical signals are reference signal such as SRS, DMRS etc. The term physical channel (e.g., in the context of channel reception) used herein is also called as 'channel. The physical channel carries higher layer information (e.g. RRC, logical control channel etc). Examples of downlink physical channels are PBCH, NPBCH, PDCCH, PDSCH, sPDSCH, MPDCCH, NPDCCH, NPDSCH, EPDCCH etc. Examples of uplink physical channels are sPUCCH. sPUSCH, PUSCH, PUCCH, NPUSCH, PRACH, NPRACH etc.

The term time resource used herein may correspond to any type of physical resource or radio resource expressed in terms of length of time and/or frequency. Signals are transmitted or received by a radio node over a time resource. Examples of time resources are: symbol, time slot, subframe, radio frame, TTI, interleaving time, etc.

Although the subject matter described herein may be implemented in any appropriate type of system using any suitable components, the embodiments disclosed herein are described in relation to a wireless network, such as the example wireless network illustrated in FIG. QQ1. For simplicity, the wireless network of FIG. QQ1 only depicts network QQ106, network nodes QQ160 and QQ160b, and WDs QQ110, QQ110b, and QQ110c. In practice, a wireless network may further include any additional elements suitable to support communication between wireless devices or between a wireless device and another communication device, such as a landline telephone, a service provider, or any other network node or end device. Of the illustrated components, network node QQ160 and wireless device (WD) QQ110 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network QQ106 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node QQ160 and WD QQ110 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. QQ1, network node QQ160 includes processing circuitry QQ170, device readable medium QQ180, interface QQ190, auxiliary equipment QQ184, power source QQ186, power circuitry QQ187, and antenna QQ162. Although network node QQ160 illustrated in the example wireless network of FIG. QQ1 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node QQ160 are depicted as single boxes located within a larger box, or nested within multiple boxes, in practice, a network node may comprise multiple different physical components that make up a single illustrated component (e.g., device readable medium QQ180 may comprise multiple separate hard drives as well as multiple RAM modules).

Similarly, network node QQ160 may be composed of multiple physically separate components (e.g., a NodeB component and a RNC component, or a BTS component and a BSC component, etc.), which may each have their own respective components. In certain scenarios in which network node QQ160 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node QQ160 may be configured to support multiple radio access technologies (RATs). In such embodiments, some components may be duplicated (e.g., separate device readable medium QQ180 for the different RATs) and some components may be reused (e.g., the same antenna QQ162 may be shared by the RATs). Network node QQ160 may also include multiple sets of the various illustrated components for different wireless technologies integrated into network node QQ160, such as, for example, GSM, WCDMA, LTE, NR, WiFi, or Bluetooth wireless technologies. These wireless technologies may be integrated into the same or different chip or set of chips and other components within network node QQ160.

Processing circuitry QQ170 is configured to perform any determining, calculating, or similar operations (e.g., certain obtaining operations) described herein as being provided by a network node. These operations performed by processing circuitry QQ170 may include processing information obtained by processing circuitry QQ170 by, for example, converting the obtained information into other information, comparing the obtained information or converted information to information stored in the network node, and/or performing one or more operations based on the obtained information or converted information, and as a result of said processing making a determination.

Processing circuitry QQ170 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node QQ160 components, such as device readable medium QQ180, network node QQ160 functionality. For example, processing circuitry QQ170 may execute instructions stored in device readable medium QQ180 or in memory within processing circuitry QQ170. Such functionality may include providing any of the various wireless features, functions, or benefits discussed herein. In some embodiments, processing circuitry QQ170 may include a system on a chip (SOC).

In some embodiments, processing circuitry QQ170 may include one or more of radio frequency (RF) transceiver circuitry QQ172 and baseband processing circuitry QQ174. In some embodiments, radio frequency (RF) transceiver circuitry QQ172 and baseband processing circuitry QQ174 may be on separate chips (or sets of chips), boards, or units, such as radio units and digital units. In alternative embodiments, part or all of RF transceiver circuitry QQ172 and baseband processing circuitry QQ174 may be on the same chip or set of chips, boards, or units In certain embodiments, some or all of the functionality described herein as being provided by a network node, base station, eNB or other such network device may be performed by processing circuitry QQ170 executing instructions stored on device readable medium QQ180 or memory within processing circuitry QQ170. In alternative embodiments, some or all of the functionality may be provided by processing circuitry QQ170 without executing instructions stored on a separate or discrete device readable medium, such as in a hard-wired manner. In any of those embodiments, whether executing instructions stored on a device readable storage medium or not, processing circuitry QQ170 can be configured to perform the described functionality. The benefits provided by such functionality are not limited to processing circuitry QQ170 alone or to other components of network node QQ160, but are enjoyed by network node QQ160 as a whole, and/or by end users and the wireless network generally.

Device readable medium QQ180 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry QQ170. Device readable medium QQ180 may store any suitable instructions, data or information, including a computer program, software, an application including one or more of logic, rules, code, tables, etc. and/or other instructions capable of being executed by processing circuitry QQ170 and, utilized by network node QQ160. Device readable medium QQ180 may be used to store any calculations made by processing circuitry QQ170 and/or any data received via interface QQ190. In some embodiments, processing circuitry QQ170 and device readable medium QQ180 may be considered to be integrated.

Interface QQ190 is used in the wired or wireless communication of signalling and/or data between network node QQ160, network QQ106, and/or WDs QQ110. As illustrated, interface QQ190 comprises port(s)/terminal(s) QQ194 to send and receive data, for example to and from network QQ106 over a wired connection. Interface QQ190 also includes radio front end circuitry QQ192 that may be coupled to, or in certain embodiments a part of, antenna QQ162. Radio front end circuitry QQ192 comprises filters QQ198 and amplifiers QQ196. Radio front end circuitry QQ192 may be connected to antenna QQ162 and processing circuitry QQ170. Radio front end circuitry may be configured to condition signals communicated between antenna QQ162 and processing circuitry QQ170. Radio front end circuitry QQ192 may receive digital data that is to be sent out to other network nodes or WDs via a wireless connection. Radio front end circuitry QQ192 may convert the digital data into a radio signal having the appropriate channel and bandwidth parameters using a combination of filters QQ198 and/or amplifiers QQ196. The radio signal may then be transmitted via antenna QQ162. Similarly, when receiving data, antenna QQ162 may collect radio signals which are then converted into digital data by radio front end circuitry QQ192. The digital data may be passed to processing circuitry QQ170. In other embodiments, the interface may comprise different components and/or different combinations of components.

In certain alternative embodiments, network node QQ160 may not include separate radio front end circuitry QQ192, instead, processing circuitry QQ170 may comprise radio front end circuitry and may be connected to antenna QQ162 without separate radio front end circuitry QQ192. Similarly, in some embodiments, all or some of RF transceiver circuitry QQ172 may be considered a part of interface QQ190. In still other embodiments, interface QQ190 may include one or more ports or terminals QQ194, radio front end circuitry QQ192, and RF transceiver circuitry QQ172, as part of a radio unit (not shown), and interface QQ190 may communicate with baseband processing circuitry QQ174, which is part of a digital unit (not shown).

Antenna QQ162 may include one or more antennas, or antenna arrays, configured to send and/or receive wireless signals. Antenna QQ162 may be coupled to radio front end circuitry QQ190 and may be any type of antenna capable of transmitting and receiving data and/or signals wirelessly. In some embodiments, antenna QQ162 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna QQ162 may be separate from network node QQ160 and may be connectable to network node QQ160 through an interface or port.

Antenna QQ162, interface QQ190, and/or processing circuitry QQ170 may be configured to perform any receiving operations and/or certain obtaining operations described herein as being performed by a network node. Any information, data and/or signals may be received from a wireless device, another network node and/or any other network equipment. Similarly, antenna QQ162, interface QQ190, and/or processing circuitry QQ170 may be configured to perform any transmitting operations described herein as being performed by a network node. Any information, data and/or signals may be transmitted to a wireless device, another network node and/or any other network equipment.

Power circuitry QQ187 may comprise, or be coupled to, power management circuitry and is configured to supply the components of network node QQ160 with power for performing the functionality described herein. Power circuitry QQ187 may receive power from power source QQ186. Power source QQ186 and/or power circuitry QQ187 may be configured to provide power to the various components of network node QQ160 in a form suitable for the respective components (e.g., at a voltage and current level needed for each respective component). Power source QQ186 may either be included in, or external to, power circuitry QQ187 and/or network node QQ160. For example, network node QQ160 may be connectable to an external power source (e.g., an electricity outlet) via an input circuitry or interface such as an electrical cable, whereby the external power source supplies power to power circuitry QQ187. As a further example, power source QQ186 may comprise a source of power in the form of a battery or battery pack which is connected to, or integrated in, power circuitry QQ187. The battery may provide backup power should the external power source fail. Other types of power sources, such as photovoltaic devices, may also be used.

Alternative embodiments of network node QQ160 may include additional components beyond those shown in FIG. QQ1 that may be responsible for providing certain aspects of the network node's functionality, including any of the functionality described herein and/or any functionality necessary to support the subject matter described herein. For example, network node QQ160 may include user interface equipment to allow input of information into network node QQ160 and to allow output of information from network node QQ160. This may allow a user to perform diagnostic, maintenance, repair, and other administrative functions for network node QQ160.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device QQ110 includes antenna QQ111, interface QQ114, processing circuitry QQ120, device readable medium QQ130, user interface equipment QQ132, auxiliary equipment QQ134, power source QQ136 and power circuitry QQ137. WD QQ110 may include multiple sets of one or more of the illustrated components for different wireless technologies supported by WD QQ110, such as, for example, GSM, WCDMA, LTE, NR, WiFi, WiMAX, or Bluetooth wireless technologies, just to mention a few. These wireless technologies may be integrated into the same or different chips or set of chips as other components within WD QQ110.

Antenna QQ111 may include one or more antennas or antenna arrays, configured to send and/or receive wireless signals, and is connected to interface QQ114. In certain alternative embodiments, antenna QQ111 may be separate from WD QQ110 and be connectable to WD QQ110 through an interface or port. Antenna QQ111, interface QQ114, and/or processing circuitry QQ120 may be configured to perform any receiving or transmitting operations described herein as being performed by a WD. Any information, data and/or signals may be received from a network node and/or another WD. In some embodiments, radio front end circuitry and/or antenna QQ111 may be considered an interface.

As illustrated, interface QQ114 comprises radio front end circuitry QQ112 and antenna QQ111. Radio front end circuitry QQ112 comprise one or more filters QQ118 and amplifiers QQ116. Radio front end circuitry QQ114 is connected to antenna QQ111 and processing circuitry QQ120, and is configured to condition signals communicated between antenna QQ111 and processing circuitry QQ120. Radio front end circuitry QQ112 may be coupled to or a part of antenna QQ111. In some embodiments, WD QQ110 may not include separate radio front end circuitry QQ112; rather, processing circuitry QQ120 may comprise radio front end circuitry and may be connected to antenna QQ111. Similarly, in some embodiments, some or all of RF transceiver circuitry QQ122 may be considered a part of interface QQ114. Radio front end circuitry QQ112 may receive digital data that is to be sent out to other network nodes or WDs via a wireless connection. Radio front end circuitry QQ112 may convert the digital data into a radio signal having the appropriate channel and bandwidth parameters using a combination of filters QQ118 and/or amplifiers QQ116. The radio signal may then be transmitted via antenna QQ111. Similarly, when receiving data, antenna QQ111 may collect radio signals which are then converted into digital data by radio front end circuitry QQ112. The digital data may be passed to processing circuitry QQ120. In other embodiments, the interface may comprise different components and/or different combinations of components.

Processing circuitry QQ120 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD QQ110 components, such as device readable medium QQ130, WD QQ110 functionality. Such functionality may include providing any of the various wireless features or benefits discussed herein. For example, processing circuitry QQ120 may execute instructions stored in device readable medium QQ130 or in memory within processing circuitry QQ120 to provide the functionality disclosed herein.

As illustrated, processing circuitry QQ120 includes one or more of RF transceiver circuitry QQ122, baseband processing circuitry QQ124, and application processing circuitry QQ126. In other embodiments, the processing circuitry may comprise different components and/or different combinations of components. In certain embodiments processing circuitry QQ120 of WD QQ110 may comprise a SOC. In some embodiments, RF transceiver circuitry QQ122, baseband processing circuitry QQ124, and application processing circuitry QQ126 may be on separate chips or sets of chips. In alternative embodiments, part or all of baseband processing circuitry QQ124 and application processing circuitry QQ126 may be combined into one chip or set of chips, and RF transceiver circuitry QQ122 may be on a separate chip or set of chips. In still alternative embodiments, part or all of RF transceiver circuitry QQ122 and baseband processing circuitry QQ124 may be on the same chip or set of chips, and application processing circuitry QQ126 may be on a separate chip or set of chips. In yet other alternative embodiments, part or all of RF transceiver circuitry QQ122, baseband processing circuitry QQ124, and application processing circuitry QQ126 may be combined in the same chip or set of chips. In some embodiments, RF transceiver circuitry QQ122 may be a part of interface QQ114. RF transceiver circuitry QQ122 may condition RF signals for processing circuitry QQ120.

In certain embodiments, some or all of the functionality described herein as being performed by a WD may be provided by processing circuitry QQ120 executing instructions stored on device readable medium QQ130, which in certain embodiments may be a computer-readable storage medium. In alternative embodiments, some or all of the functionality may be provided by processing circuitry QQ120 without executing instructions stored on a separate or discrete device readable storage medium, such as in a hard-wired manner. In any of those particular embodiments, whether executing instructions stored on a device readable storage medium or not, processing circuitry QQ120 can be configured to perform the described functionality. The benefits provided by such functionality are not limited to processing circuitry QQ120 alone or to other components of WD QQ110, but are enjoyed by WD QQ110 as a whole, and/or by end users and the wireless network generally.

Processing circuitry QQ120 may be configured to perform any determining, calculating, or similar operations (e.g., certain obtaining operations) described herein as being performed by a WD. These operations, as performed by processing circuitry QQ120, may include processing information obtained by processing circuitry QQ120 by, for example, converting the obtained information into other information, comparing the obtained information or converted information to information stored by WD QQ110, and/or performing one or more operations based on the obtained information or converted information, and as a result of said processing making a determination.

Device readable medium QQ130 may be operable to store a computer program, software, an application including one or more of logic, rules, code, tables, etc. and/or other instructions capable of being executed by processing circuitry QQ120. Device readable medium QQ130 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry QQ120. In some embodiments, processing circuitry QQ120 and device readable medium QQ130 may be considered to be integrated.

User interface equipment QQ132 may provide components that allow for a human user to interact with WD QQ110. Such interaction may be of many forms, such as visual, audial, tactile, etc. User interface equipment QQ132 may be operable to produce output to the user and to allow the user to provide input to WD QQ110. The type of interaction may vary depending on the type of user interface equipment QQ132 installed in WD QQ110. For example, if WD QQ110 is a smart phone, the interaction may be via a touch screen; if WD QQ110 is a smart meter, the interaction may be through a screen that provides usage (e.g., the number of gallons used) or a speaker that provides an audible alert (e.g., if smoke is detected). User interface equipment QQ132 may include input interfaces, devices and circuits, and output interfaces, devices and circuits. User interface equipment QQ132 is configured to allow input of information into WD QQ110, and is connected to processing circuitry QQ120 to allow processing circuitry QQ120 to process the input information. User interface equipment QQ132 may include, for example, a microphone, a proximity or other sensor, keys/buttons, a touch display, one or more cameras, a USB port, or other input circuitry. User interface equipment QQ132 is also configured to allow output of information from WD QQ110, and to allow processing circuitry QQ120 to output information from WD QQ110. User interface equipment QQ132 may include, for example, a speaker, a display, vibrating circuitry, a USB port, a headphone interface, or other output circuitry. Using one or more input and output interfaces, devices, and circuits, of user interface equipment QQ132, WD QQ110 may communicate with end users and/or the wireless network, and allow them to benefit from the functionality described herein.

Auxiliary equipment QQ134 is operable to provide more specific functionality which may not be generally performed by WDs. This may comprise specialized sensors for doing measurements for various purposes, interfaces for additional types of communication such as wired communications etc. The inclusion and type of components of auxiliary equipment QQ134 may vary depending on the embodiment and/or scenario.

Power source QQ136 may, in some embodiments, be in the form of a battery or battery pack. Other types of power sources, such as an external power source (e.g., an electricity outlet), photovoltaic devices or power cells, may also be used. WD QQ110 may further comprise power circuitry QQ137 for delivering power from power source QQ136 to the various parts of WD QQ110 which need power from power source QQ136 to carry out any functionality described or indicated herein. Power circuitry QQ137 may in certain embodiments comprise power management circuitry. Power circuitry QQ137 may additionally or alternatively be operable to receive power from an external power source; in which case WD QQ110 may be connectable to the external power source (such as an electricity outlet) via input circuitry or an interface such as an electrical power cable. Power circuitry QQ137 may also in certain embodiments be operable to deliver power from an external power source to power source QQ136. This may be, for example, for the charging of power source QQ136. Power circuitry QQ137 may perform any formatting, converting, or other modification to the power from power source QQ136 to make the power suitable for the respective components of WD QQ110 to which power is supplied.

FIG. QQ2 illustrates one embodiment of a UE in accordance with various aspects described herein. As used herein, a user equipment or UE may not necessarily have a user in the sense of a human user who owns and/or operates the relevant device. Instead, a UE may represent a device that is intended for sale to, or operation by, a human user but which may not, or which may not initially, be associated with a specific human user (e.g., a smart sprinkler controller). Alternatively, a UE may represent a device that is not intended for sale to, or operation by, an end user but which may be associated with or operated for the benefit of a user (e.g., a smart power meter). UE QQ2200 may be any UE identified by the 3rd Generation Partnership Project (3GPP), including a NB-IoT UE, a machine type communication (MTC) UE, and/or an enhanced MTC (eMTC) UE. UE QQ200, as illustrated in FIG. QQ2, is one example of a WD configured for communication in accordance with one or more communication standards promulgated by the 3rd Generation Partnership Project (3GPP), such as 3GPP's GSM, UMTS, LTE, and/or 5G standards. As mentioned previously, the term WD and UE may be used interchangeable. Accordingly, although FIG. QQ2 is a UE, the components discussed herein are equally applicable to a WD, and vice-versa.

In FIG. QQ2, UE QQ200 includes processing circuitry QQ201 that is operatively coupled to input/output interface QQ205, radio frequency (RF) interface QQ209, network connection interface QQ211, memory QQ215 including random access memory (RAM) QQ217, read-only memory (ROM) QQ219, and storage medium QQ221 or the like, communication subsystem QQ231, power source QQ233, and/or any other component, or any combination thereof. Storage medium QQ221 includes operating system QQ223, application program QQ225, and data QQ227. In other embodiments, storage medium QQ221 may include other similar types of information. Certain UEs may utilize all of the components shown in FIG. QQ2, or only a subset of the components. The level of integration between the components may vary from one UE to another UE. Further, certain UEs may contain multiple instances of a component, such as multiple processors, memories, transceivers, transmitters, receivers, etc.

In FIG. QQ2, processing circuitry QQ201 may be configured to process computer instructions and data. Processing circuitry QQ201 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry QQ201 may include two central processing units (CPUs). Data may be information in a form suitable for use by a computer.

In the depicted embodiment, input/output interface QQ205 may be configured to provide a communication interface to an input device, output device, or input and output device. UE QQ200 may be configured to use an output device via input/output interface QQ205. An output device may use the same type of interface port as an input device. For example, a USB port may be used to provide input to and output from UE QQ200. The output device may be a speaker, a sound card, a video card, a display, a monitor, a printer, an actuator, an emitter, a smartcard, another output device, or any combination thereof. UE QQ200 may be configured to use an input device via input/output interface QQ205 to allow a user to capture information into UE QQ200. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor.

In FIG. QQ2, RF interface QQ209 may be configured to provide a communication interface to RF components such as a transmitter, a receiver, and an antenna. Network connection interface QQ211 may be configured to provide a communication interface to network QQ243a. Network QQ243a may encompass wired and/or wireless networks such as a local-area network (LAN), a wide-area network (WAN), a computer network, a wireless network, a telecommunications network, another like network or any combination thereof. For example, network QQ243a may comprise a Wi-Fi network. Network connection interface QQ211 may be configured to include a receiver and a transmitter interface used to communicate with one or more other devices over a communication network according to one or more communication protocols, such as Ethernet, TCP/IP, SONET, ATM, or the like. Network connection interface QQ211 may implement receiver and transmitter functionality appropriate to the communication network links (e.g., optical, electrical, and the like). The transmitter and receiver functions may share circuit components, software or firmware, or alternatively may be implemented separately.

RAM QQ217 may be configured to interface via bus QQ202 to processing circuitry QQ201 to provide storage or caching of data or computer instructions during the execution of software programs such as the operating system, application programs, and device drivers. ROM QQ219 may be configured to provide computer instructions or data to processing circuitry QQ201. For example, ROM QQ219 may be configured to store invariant low-level system code or data for basic system functions such as basic input and output (I/O), startup, or reception of keystrokes from a keyboard that are stored in a non-volatile memory. Storage medium QQ221 may be configured to include memory such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, or flash drives. In one example, storage medium QQ221 may be configured to include operating system QQ223, application program QQ225 such as a web browser application, a widget or gadget engine or another application, and data file QQ227. Storage medium QQ221 may store, for use by UE QQ200, any of a variety of various operating systems or combinations of operating systems.

Storage medium QQ221 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium QQ221 may allow UE QQ200 to access computer-executable instructions, application programs or the like, stored on transitory or non-transitory memory media, to off-load data, or to upload data. An article of manufacture, such as one utilizing a communication system may be tangibly embodied in storage medium QQ221, which may comprise a device readable medium.

In FIG. QQ2, processing circuitry QQ201 may be configured to communicate with network QQ243b using communication subsystem QQ231. Network QQ243a and network QQ243b may be the same network or networks or different network or networks.

Communication subsystem QQ231 may be configured to include one or more transceivers used to communicate with network QQ243b. For example, communication subsystem QQ231 may be configured to include one or more transceivers used to communicate with one or more remote transceivers of another device capable of wireless communication such as another WD, UE, or base station of a radio access network (RAN) according to one or more communication protocols, such as IEEE 802.QQ2, CDMA, WCDMA, GSM, LTE, UTRAN, WiMax, or the like. Each transceiver may include transmitter QQ233 and/or receiver QQ235 to implement transmitter or receiver functionality, respectively, appropriate to the RAN links (e.g., frequency allocations and the like). Further, transmitter QQ233 and receiver QQ235 of each transceiver may share circuit components, software or firmware, or alternatively may be implemented separately.

In the illustrated embodiment, the communication functions of communication subsystem QQ231 may include data communication, voice communication, multimedia communication, short-range communications such as Bluetooth, near-field communication, location-based communication such as the use of the global positioning system (GPS) to determine a location, another like communication function, or any combination thereof. For example, communication subsystem QQ231 may include cellular communication, Wi-Fi communication, Bluetooth communication, and GPS communication. Network QQ243b may encompass wired and/or wireless networks such as a local-area network (LAN), a wide-area network (WAN), a computer network, a wireless network, a telecommunications network, another like network or any combination thereof. For example, network QQ243b may be a cellular network, a Wi-Fi network, and/or a near-field network. Power source QQ213 may be configured to provide alternating current (AC) or direct current (DC) power to components of UE QQ200.

The features, benefits and/or functions described herein may be implemented in one of the components of UE QQ200 or partitioned across multiple components of UE QQ200. Further, the features, benefits, and/or functions described herein may be implemented in any combination of hardware, software or firmware. In one example, communication subsystem QQ231 may be configured to include any of the components described herein. Further, processing circuitry QQ201 may be configured to communicate with any of such components over bus QQ202. In another example, any of such components may be represented by program instructions stored in memory that when executed by processing circuitry QQ201 perform the corresponding functions described herein. In another example, the functionality of any of such components may be partitioned between processing circuitry QQ201 and communication subsystem QQ231. In another example, the non-computationally intensive functions of any of such components may be implemented in software or firmware and the computationally intensive functions may be implemented in hardware.

FIG. QQ3 is a schematic block diagram illustrating a virtualization environment QQ300 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a UE, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments QQ300 hosted by one or more of hardware nodes QQ330. Further, in embodiments in which the virtual node is not a radio access node or does not require radio connectivity (e.g., a core network node), then the network node may be entirely virtualized.

The functions may be implemented by one or more applications QQ320 (which may alternatively be called software instances, virtual appliances, network functions, virtual nodes, virtual network functions, etc.) operative to implement some of the features, functions, and/or benefits of some of the embodiments disclosed herein. Applications QQ320 are run in virtualization environment QQ300 which provides hardware QQ330 comprising processing circuitry QQ360 and memory QQ390. Memory QQ390 contains instructions QQ395 executable by processing circuitry QQ360 whereby application QQ320 is operative to provide one or more of the features, benefits, and/or functions disclosed herein.

Virtualization environment QQ300, comprises general-purpose or special-purpose network hardware devices QQ330 comprising a set of one or more processors or processing circuitry QQ360, which may be commercial off-the-shelf (COTS) processors, dedicated Application Specific Integrated Circuits (ASICs), or any other type of processing circuitry including digital or analog hardware components or special purpose processors. Each hardware device may comprise memory QQ390-1 which may be non-persistent memory for temporarily storing instructions QQ395 or software executed by processing circuitry QQ360. Each hardware device may comprise one or more network interface controllers (NICs) QQ370, also known as network interface cards, which include physical network interface QQ380. Each hardware device may also include non-transitory, persistent, machine-readable storage media QQ390-2 having stored therein software QQ395 and/or instructions executable by processing circuitry QQ360. Software QQ395 may include any type of software including software for instantiating one or more virtualization layers QQ350 (also referred to as hypervisors), software to execute virtual machines QQ340 as well as software allowing it to execute functions, features and/or benefits described in relation with some embodiments described herein.

Virtual machines QQ340, comprise virtual processing, virtual memory, virtual networking or interface and virtual storage, and may be run by a corresponding virtualization layer QQ350 or hypervisor. Different embodiments of the instance of virtual appliance QQ320 may be implemented on one or more of virtual machines QQ340, and the implementations may be made in different ways.

During operation, processing circuitry QQ360 executes software QQ395 to instantiate the hypervisor or virtualization layer QQ350, which may sometimes be referred to as a virtual machine monitor (VMM). Virtualization layer QQ350 may present a virtual operating platform that appears like networking hardware to virtual machine QQ340.

As shown in FIG. QQ3, hardware QQ330 may be a standalone network node with generic or specific components. Hardware QQ330 may comprise antenna QQ3225 and may implement some functions via virtualization. Alternatively, hardware QQ330 may be part of a larger cluster of hardware (e.g. such as in a data center or customer premise equipment (CPE)) where many hardware nodes work together and are managed via management and orchestration (MANO) QQ3100, which, among others, oversees lifecycle management of applications QQ320.

Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, virtual machine QQ340 may be a software implementation of a physical machine that runs programs as if they were executing on a physical, non-virtualized machine. Each of virtual machines QQ340, and that part of hardware QQ330 that executes that virtual machine, be it hardware dedicated to that virtual machine and/or hardware shared by that virtual machine with others of the virtual machines QQ340, forms a separate virtual network elements (VNE).

Still in the context of NFV, Virtual Network Function (VNF) is responsible for handling specific network functions that run in one or more virtual machines QQ340 on top of hardware networking infrastructure QQ330 and corresponds to application QQ320 in FIG. QQ3.

In some embodiments, one or more radio units QQ3200 that each include one or more transmitters QQ3220 and one or more receivers QQ3210 may be coupled to one or more antennas QQ3225. Radio units QQ3200 may communicate directly with hardware nodes QQ330 via one or more appropriate network interfaces and may be used in combination with the virtual components to provide a virtual node with radio capabilities, such as a radio access node or a base station.

In some embodiments, some signalling can be effected with the use of control system QQ3230 which may alternatively be used for communication between the hardware nodes QQ330 and radio units QQ3200.

With reference to FIG. QQ4, in accordance with an embodiment, a communication system includes telecommunication network QQ410, such as a 3GPP-type cellular network, which comprises access network QQ411, such as a radio access network, and core network QQ414. Access network QQ411 comprises a plurality of base stations QQ412a, QQ412b, QQ412c, such as NBs, eNBs, gNBs or other types of wireless access points, each defining a corresponding coverage area QQ413a, QQ413b, QQ413c. Each base station QQ412a, QQ412b, QQ412c is connectable to core network QQ414 over a wired or wireless connection QQ415. A first UE QQ491 located in coverage area QQ413c is configured to wirelessly connect to, or be paged by, the corresponding base station QQ412c. A second UE QQ492 in coverage area QQ413a is wirelessly connectable to the corresponding base station QQ412a. While a plurality of UEs QQ491, QQ492 are illustrated in this example, the disclosed embodiments are equally applicable to a situation where a sole UE is in the coverage area or where a sole UE is connecting to the corresponding base station QQ412.

Telecommunication network QQ410 is itself connected to host computer QQ430, which may be embodied in the hardware and/or software of a standalone server, a cloud-implemented server, a distributed server or as processing resources in a server farm. Host computer QQ430 may be under the ownership or control of a service provider, or may be operated by the service provider or on behalf of the service provider. Connections QQ421 and QQ422 between telecommunication network QQ410 and host computer QQ430 may extend directly from core network QQ414 to host computer QQ430 or may go via an optional intermediate network QQ420. Intermediate network QQ420 may be one of, or a combination of more than one of, a public, private or hosted network; intermediate network QQ420, if any, may be a backbone network or the Internet; in particular, intermediate network QQ420 may comprise two or more sub-networks (not shown).

The communication system of FIG. QQ4 as a whole enables connectivity between the connected UEs QQ491, QQ492 and host computer QQ430. The connectivity may be described as an over-the-top (OTT) connection QQ450. Host computer QQ430 and the connected UEs QQ491, QQ492 are configured to communicate data and/or signaling via OTT connection QQ450, using access network QQ411, core network QQ414, any intermediate network QQ420 and possible further infrastructure (not shown) as intermediaries. OTT connection QQ450 may be transparent in the sense that the participating communication devices through which OTT connection QQ450 passes are unaware of routing of uplink and downlink communications. For example, base station QQ412 may not or need not be informed about the past routing of an incoming downlink communication with data originating from host computer QQ430 to be forwarded (e.g., handed over) to a connected UE QQ491. Similarly, base station QQ412 need not be aware of the future routing of an outgoing uplink communication originating from the UE QQ491 towards the host computer QQ430.

Example implementations, in accordance with an embodiment, of the UE, base station and host computer discussed in the preceding paragraphs will now be described with reference to FIG. QQ5. In communication system QQ500, host computer QQ510 comprises hardware QQ515 including communication interface QQ516 configured to set up and maintain a wired or wireless connection with an interface of a different communication device of communication system QQ500. Host computer QQ510 further comprises processing circuitry QQ518, which may have storage and/or processing capabilities. In particular, processing circuitry QQ518 may comprise one or more programmable processors, application-specific integrated circuits, field programmable gate arrays or combinations of these (not shown) adapted to execute instructions. Host computer QQ510 further comprises software QQ511, which is stored in or accessible by host computer QQ510 and executable by processing circuitry QQ518. Software QQ511 includes host application QQ512. Host application QQ512 may be operable to provide a service to a remote user, such as UE QQ530 connecting via OTT connection QQ550 terminating at UE QQ530 and host computer QQ510. In providing the service to the remote user, host application QQ512 may provide user data which is transmitted using OTT connection QQ550.

Communication system QQ500 further includes base station QQ520 provided in a telecommunication system and comprising hardware QQ525 enabling it to communicate with host computer QQ510 and with UE QQ530. Hardware QQ525 may include communication interface QQ526 for setting up and maintaining a wired or wireless connection with an interface of a different communication device of communication system QQ500, as well as radio interface QQ527 for setting up and maintaining at least wireless connection QQ570 with UE QQ530 located in a coverage area (not shown in FIG. QQ5) served by base station QQ520. Communication interface QQ526 may be configured to facilitate connection QQ560 to host computer QQ510. Connection QQ560 may be direct or it may pass through a core network (not shown in FIG. QQ5) of the telecommunication system and/or through one or more intermediate networks outside the telecommunication system. In the embodiment shown, hardware QQ525 of base station QQ520 further includes processing circuitry QQ528, which may comprise one or more programmable processors, application-specific integrated circuits, field programmable gate arrays or combinations of these (not shown) adapted to execute instructions. Base station QQ520 further has software QQ521 stored internally or accessible via an external connection.

Communication system QQ500 further includes UE QQ530 already referred to. Its hardware QQ535 may include radio interface QQ537 configured to set up and maintain wireless connection QQ570 with a base station serving a coverage area in which UE QQ530 is currently located. Hardware QQ535 of UE QQ530 further includes processing circuitry QQ538, which may comprise one or more programmable processors, application-specific integrated circuits, field programmable gate arrays or combinations of these (not shown) adapted to execute instructions. UE QQ530 further comprises software QQ531, which is stored in or accessible by UE QQ530 and executable by processing circuitry QQ538. Software QQ531 includes client application QQ532. Client application QQ532 may be operable to provide a service to a human or non-human user via UE QQ530, with the support of host computer QQ510. In host computer QQ510, an executing host application QQ512 may communicate with the executing client application QQ532 via OTT connection QQ550 terminating at UE QQ530 and host computer QQ510. In providing the service to the user, client application QQ532 may receive request data from host application QQ512 and provide user data in response to the request data. OTT connection QQ550 may transfer both the request data and the user data. Client application QQ532 may interact with the user to generate the user data that it provides.

It is noted that host computer QQ510, base station QQ520 and UE QQ530 illustrated in FIG. QQ5 may be similar or identical to host computer QQ430, one of base stations QQ412a, QQ412b, QQ412c and one of UEs QQ491, QQ492 of FIG. QQ4, respectively. This is to say, the inner workings of these entities may be as shown in FIG. QQ5 and independently, the surrounding network topology may be that of FIG. QQ4.

In FIG. QQ5, OTT connection QQ550 has been drawn abstractly to illustrate the communication between host computer QQ510 and UE QQ530 via base station QQ520, without explicit reference to any intermediary devices and the precise routing of messages via these devices. Network infrastructure may determine the routing, which it may be configured to hide from UE QQ530 or from the service provider operating host computer QQ510, or both. While OTT connection QQ550 is active, the network infrastructure may further take decisions by which it dynamically changes the routing (e.g., on the basis of load balancing consideration or reconfiguration of the network).

A measurement procedure may be provided for the purpose of monitoring data rate, latency and other factors on which the one or more embodiments improve. There may further be an optional network functionality for reconfiguring OTT connection QQ550 between host computer QQ510 and UE QQ530, in response to variations in the measurement results. The measurement procedure and/or the network functionality for reconfiguring OTT connection QQ550 may be implemented in software QQ511 and hardware QQ515 of host computer QQ510 or in software QQ531 and hardware QQ535 of UE QQ530, or both. In embodiments, sensors (not shown) may be deployed in or in association with communication devices through which OTT connection QQ550 passes; the sensors may participate in the measurement procedure by supplying values of the monitored quantities exemplified above, or supplying values of other physical quantities from which software QQ511, QQ531 may compute or estimate the monitored quantities. The reconfiguring of OTT connection QQ550 may include message format, retransmission settings, preferred routing etc.; the reconfiguring need not affect base station QQ520, and it may be unknown or imperceptible to base station QQ520. Such procedures and functionalities may be known and practiced in the art. In certain embodiments, measurements may involve proprietary UE signaling facilitating host computer QQ510's measurements of throughput, propagation times, latency and the like. The measurements may be implemented in that software QQ511 and QQ531 causes messages to be transmitted, in particular empty or 'dummy' messages, using OTT connection QQ550 while it monitors propagation times, errors etc.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

Abbreviations

At least some of the following abbreviations may be used in this disclosure. If there is an inconsistency between abbreviations, preference should be given to how it is used above. If listed multiple times below, the first listing should be preferred over any subsequent listing(s).

1×RTT CDMA2000 1× Radio Transmission Technology
3GPP 3rd Generation Partnership Project
5G 5th Generation
ABS Almost Blank Subframe
ARQ Automatic Repeat Request
AWGN Additive White Gaussian Noise
BCCH Broadcast Control Channel
BCH Broadcast Channel
CA Carrier Aggregation
CC Carrier Component
CCCH SDU Common Control Channel SDU
CDMA Code Division Multiplexing Access
CGI Cell Global Identifier
CIR Channel Impulse Response
CP Cyclic Prefix
CPICH Common Pilot Channel
CPICH Ec/No CPICH Received energy per chip divided by the power density in the band
CQI Channel Quality information
C-RNTI Cell RNTI
CSI Channel State Information
DCCH Dedicated Control Channel
DL Downlink
DM Demodulation
DMRS Demodulation Reference Signal
DRX Discontinuous Reception
DTX Discontinuous Transmission
DTCH Dedicated Traffic Channel
DUT Device Under Test
E-CID Enhanced Cell-ID (positioning method)
E-SMLC Evolved-Serving Mobile Location Centre
ECGI Evolved CGI
eNB E-UTRAN NodeB
ePDCCH enhanced Physical Downlink Control Channel
E-SMLC evolved Serving Mobile Location Center
E-UTRA Evolved UTRA
E-UTRAN Evolved UTRAN
FDD Frequency Division Duplex
FFS For Further Study
GERAN GSM EDGE Radio Access Network
gNB Base station in NR
GNSS Global Navigation Satellite System
GSMGlobal System for Mobile communication
HARQ Hybrid Automatic Repeat Request
HO Handover
HSPA High Speed Packet Access
HRPD High Rate Packet Data
LOS Line of Sight
LPP LTE Positioning Protocol
LTE Long-Term Evolution
MAC Medium Access Control
MBMS Multimedia Broadcast Multicast Services
MBSFN Multimedia Broadcast multicast service Single Frequency Network
MBSFN ABS MBSFN Almost Blank Subframe
MDT Minimization of Drive Tests
MIB Master Information Block
MME Mobility Management Entity
MSC Mobile Switching Center
NPDCCH Narrowband Physical Downlink Control Channel
NR New Radio
OCNG OFDMA Channel Noise Generator
OFDM Orthogonal Frequency Division Multiplexing
OFDMA Orthogonal Frequency Division Multiple Access
OSS Operations Support System
OTDOA Observed Time Difference of Arrival
O&M Operation and Maintenance
PBCH Physical Broadcast Channel
P-CCPCH Primary Common Control Physical Channel
PCell Primary Cell
PCFICH Physical Control Format Indicator Channel
PDCCH Physical Downlink Control Channel
PDP Profile Delay Profile
PDSCH Physical Downlink Shared Channel
PGW Packet Gateway
PHICH Physical Hybrid-ARQ Indicator Channel
PLMN Public Land Mobile Network
PMI Precoder Matrix Indicator
PRACH Physical Random Access Channel
PRS Positioning Reference Signal
PSS Primary Synchronization Signal
PUCCH Physical Uplink Control Channel
PUSCH Physical Uplink Shared Channel
RACH Random Access Channel
QAM Quadrature Amplitude Modulation
RAN Radio Access Network
RAT Radio Access Technology
RLMRadio Link Management
RNC Radio Network Controller
RNTI Radio Network Temporary Identifier
RRC Radio Resource Control
RRM Radio Resource Management
RS Reference Signal
RSCP Received Signal Code Power
RSRP Reference Symbol Received Power OR Reference Signal Received Power
RSRQ Reference Signal Received Quality OR Reference Symbol Received Quality
RS SI Received Signal Strength Indicator
RSTD Reference Signal Time Difference
SCH Synchronization Channel
SCell Secondary Cell
SDU Service Data Unit
SFN System Frame Number
SGW Serving Gateway
SI System Information
SIB System Information Block SNR Signal to Noise Ratio
SON Self Optimized Network
SS Synchronization Signal
SSS Secondary Synchronization Signal
TDD Time Division Duplex
TDOA Time Difference of Arrival
TOA Time of Arrival
TSS Tertiary Synchronization Signal
TTI Transmission Time Interval
UE User Equipment
UL Uplink
UMTS Universal Mobile Telecommunication System
USIM Universal Subscriber Identity Module
UTDOA Uplink Time Difference of Arrival
UTRA Universal Terrestrial Radio Access
UTRAN Universal Terrestrial Radio Access Network
WCDMA Wide CDMA
WLAN Wide Local Area Network
CRS Cell-specific Reference Signal
NPBCH Narrowband Physical Broadcast CHannel
NPDSCH Narrowband Physical Downlink Shared CHannel
NPRACH Narrowband Physical Random Access CHannel
NPUSCH Narrowband Physical Uplink Shared CHannel
SPDCCH Short Physical Downlink Control Channel
SPDSCH Short Physical Downlink Shared Channel
SPUCCH Short Physical Uplink Control Channel
SPUSCH Short Physical Uplink Shared Channel

What is claimed is:

1. A method of operating a first communication node, the method comprising:
receiving a communication at the first communication node from a second communication node, the communication including information bits in a plurality of information bit positions;
determining, by the first communication node, a subset of the information bit positions of the communication that are punctured, the determining being performed based on detected or decoded control information;
responsive to determining the subset, reducing, by the first communication node, magnitudes of information bits in the subset of the information bit positions that are punctured;
determining at the first communication node an estimate of a modulation used in a search space; and
the subset of the information bit positions that are punctured being determined responsive to determining that the estimate of the modulation is different than a signaled modulation that is signaled on a scheduling assignment from the second communication node.

2. The method of claim 1, further comprising:
determining the subset of the information bit positions based on a decoded downlink control indicator associated with uplink communication from the first communication node to the second communication node.

3. The method of claim 1, further comprising:
determining the subset of the information bit positions based on detected modulation symbols being different from modulation symbols associated with the information bits.

4. The method of claim 1, further comprising:
decoding the information bits in the communication including the information bits in the subset of information bit positions that are punctured responsive to reducing the magnitudes of the information bits in the subset of information bit positions.

5. The method of claim 4, wherein decoding the information bits comprises rate matching a number of the information bits in the communication including the information bits in the subset of information bit positions that are punctured.

6. The method of claim 4, wherein decoding the information bits in the communication comprises decoding the information bits in the communication excluding control bits in the communication associated with downlink data.

7. The method of claim 1, wherein reducing the magnitudes of the information bits in the subset of information bit positions that are punctured comprises zeroing out magnitudes of soft bit values of the information bits in the subset of information bit positions that are punctured.

8. The method of claim 1, wherein reducing the magnitudes of the information bits in the subset of information bit positions that are punctured comprises setting magnitudes of soft bit values of the information bits in the subset of information bit positions that are punctured to a small number.

9. The method of claim 1, wherein reducing the magnitudes of the information bits in the subset of information bit positions that are punctured comprises down scaling magnitudes of soft bit values of the information bits in the subset of information bit positions that are punctured.

10. The method of claim 1, wherein the subset of the information bit positions that are punctured include control information.

11. The method of claim 10, wherein the communication is a first communication, and wherein the control information comprises uplink control information that is associated with a second communication from the first communication node to the second communication node.

12. The method of claim 11, further comprising:
transmitting the second communication from the first communication node to the second communication node, wherein the second communication is transmitted using the control information.

13. The method of claim 10, further comprising:
detecting information bits in the subset of the information bit positions that are punctured to obtain the control information.

14. The method of claim 10, wherein a location in a time-frequency space of the subset of the information bit positions that are punctured is known to the first communication node.

15. The method of claim 14, further comprising:
detecting downlink control information, DCI, in the communication; and
determining the location of the subset of information bit positions that are punctured from the DCI.

16. The method of claim 15, wherein the DCI comprises uplink, UL, DCI that schedules UL resources for use by the first communication node.

17. The method of claim 10, wherein the control information was provided by the second communication node to override data bits in the subset of the information bit positions that are punctured.

18. The method of claim 10 further comprising:
receiving downlink control information, DCI, at the first communication node from the second communication node, wherein the DCI indicates that the control information is included in the subset of the information bits that are punctured.

19. The method of claim 10, further comprising:
receiving downlink control information at the first communication node from the second communication, wherein the downlink control information indicates that the control information is associated with a third communication node.

20. The method of claim 19, wherein the first communication node comprises a first user equipment node, wherein the second communication node comprises a radio access network node, and wherein the third communication node comprises a second user equipment node.

21. The method of claim 1, wherein the first communication node comprises a user equipment node, the second communication node comprises a radio access network node, and wherein the communication comprises a downlink communication.

22. A first communication node comprising:
a transceiver configured to provide communication with a second communication node over a wireless interface; and
a processor coupled with the transceiver, the processor being configured to provide reception/transmission from/to the second communication node through the transceiver, and the processor configured to perform operations comprising:

receiving, from a second communication node, the communication including information bits in a plurality of information bit positions;

determining a subset of the information bit positions of the communication that are punctured, the determining being performed based on detected or decoded control information; and responsive to determining the subset, reducing magnitudes of information bits in the subset of the information bit positions that are punctured;

determining an estimate of a modulation used in a search space; and the subset of the information bit positions that are punctured being determined responsive to determining that the estimate of the modulation is different than a signaled modulation that is signaled on a scheduling assignment from the second communication node.

* * * * *